(12) United States Patent
Morikawa

(10) Patent No.: US 7,027,341 B2
(45) Date of Patent: Apr. 11, 2006

(54) SEMICONDUCTOR READOUT CIRCUIT

(75) Inventor: Yoshinao Morikawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/022,401

(22) Filed: Dec. 22, 2004

(65) Prior Publication Data
US 2005/0162953 A1    Jul. 28, 2005

(30) Foreign Application Priority Data
Dec. 26, 2003  (JP)  .............................. 2003-433813

(51) Int. Cl.
*G11C 7/00*    (2006.01)
(52) U.S. Cl. .................. 365/203; 365/207; 365/189.09
(58) Field of Classification Search ................ 365/203, 365/207, 189.09
See application file for complete search history.

(56)  References Cited

U.S. PATENT DOCUMENTS

| 5,537,349 | A | * | 7/1996 | Devin ................... 365/185.33 |
| 5,671,186 | A |   | 9/1997 | Igura et al. |
| 5,808,934 | A | * | 9/1998 | Kubo et al. ................. 365/182 |
| 6,191,979 | B1 | * | 2/2001 | Uekubo ................. 365/185.25 |
| 6,353,560 | B1 | * | 3/2002 | Morikawa ............... 365/189.09 |
| 6,944,077 | B1 | * | 9/2005 | Morikawa .................... 365/204 |

FOREIGN PATENT DOCUMENTS

| EP | 1049102 A2 | 11/2000 |
| JP | 2000-311493 A | 11/2000 |

OTHER PUBLICATIONS

European Search Report mailed Sep. 27, 2005 for European Patent Application No. 04 25 8043, 3 pages.

* cited by examiner

*Primary Examiner*—Tuan T. Nguyen
(74) *Attorney, Agent, or Firm*—Morrison & Foerster LLP

(57) ABSTRACT

A semiconductor readout circuit includes a precharge circuit which charges a bit line connected to a memory cell to its predetermined precharge voltage before reading out information stored in the memory cell, a feedback-type bias circuit which controls a voltage of the bit line to its predetermined voltage, a sense amplifier which detects and amplifies a change in a voltage of a readout input node connected to the bit line via a transfer gate of the feedback-type bias circuit, and a load circuit which charges the readout input node. The load circuit is made inactive at least for a fixed period immediately before ending of a precharge period when the precharge circuit is active, and is made active after ending of the precharge period.

15 Claims, 23 Drawing Sheets

SEMICONDUCTOR READOUT CIRCUIT

CROSS REFERENCE TO RELATED APPLICATION

This Nonprovisional application claims priority under 35 U.S.C. §119(a) on Patent Application Ser. No. 2003-433813 filed in Japan on Dec. 26, 2003, the entire contents of which are hereby incorporated by reference.

BACKGROUND OF THE INVENTION

1. Field of the Invention

The present invention relates to a semiconductor device, in particular, a semiconductor memory device. More specifically, the invention relates to a semiconductor readout circuit capable of reading out data in a memory cell of a semiconductor device at a high speed.

2. Description of the Related Art

Conventionally, as nonvolatile memories that are electrically rewritable, various nonvolatile memories such as an EEPROM, a flash EEPROM (hereinafter, flash memory), an SW memory (side wall memory) where a memory cell has a electric charge keeping area at the side of a control gate, and so forth are present and disclosed. These nonvolatile memories are in common in that data is memorized into a memory cell and read out therefrom. There are various structures in memory cells, and for example, in a flash memory, a MOSFET equipped with a floating gate is used as a memory cell. In the flash memory, the threshold voltage of a transistor changes according to the electric charge accumulation condition of a floating gate of this memory cell, and this threshold value are memorized as data. When data is to be read out from the memory cell, a predetermined readout voltage is impressed via a bit line to the drain of a selected memory cell by a word line connected to the control gate of the memory cell, and the bit line connected to the drain of the memory cell, and changes in memory cell current owing to the difference in the sizes of the threshold voltage of the memory cell transistor, i.e., changes in the current of the bit line connected to the memory cell are detected and amplified by a circuit such as a sense amplifier or so, thereby data is read out.

FIG. 15 shows a memory cell readout circuit 100 according to the conventional art. In the circuit shown in FIG. 15, when a memory cell to be read out is to be selected among a memory array 104 where memory cells are arranged in array, it is selected by use of a bit line selection transistor 105 and a word line WL which is input to the memory array 104. In the circuit shown in FIG. 15, the readout circuit 100 comprises a feedback-type bias circuit 101, a load circuit 102, and a comparator circuit 103, to the memory array 104.

Operations of the readout circuit 100 shown in FIG. 15 will be briefly described hereinafter. In the case where the memory array 104 is structured by flash memory cells, by the word line WL and the bit line BL, the memory cell as a readout objective in the memory array 104 is selected. Before this selection operation, the bit line voltage is supposed to be at GND level (ground voltage). In FIG. 15, for simplicity of explanations, only one line is illustrated for each of the word line WL and the bit line BL.

When the word line WL of the memory cell to be read out is selected, and the bit line BL of the memory cell to be read out is selected by the bit line selection transistor 105, charging of the selected bit line BL is started via charging of the node N2 by the load circuit 102. When the charging of the bit line BL is carried out to a certain voltage, by the feedback-type bias circuit 101, the bit line voltage is kept at a predetermined voltage, and the voltage of the readout input node N1 is determined according to the current flowing through memory cells and the voltage-current characteristics of the load circuit 102. The voltage of the readout input node N1, with the same load circuit 102, changes according to the current flowing through memory cells. The current flowing memory cells, in the case of a flash memory, changes according to threshold voltage, therefore the voltage of the readout input node N1 changes according to the threshold voltage of the flash memory.

Among inputs of the comparator circuit 103, the reference voltage Vref with respect to the voltage of the readout input node N1 is set to a voltage at which changes in a voltage of the readout input node N1 can be judged in the comparator circuit 103. For example, the intermediate voltage between the voltages of the readout input node N1 when the threshold voltage of the memory cell is high and low resepectively is made as the reference voltage Vref.

When the threshold voltage is low and memory cell current flows, the readout input node N1 outputs a voltage which is lower than the reference voltage Vref, and when the threshold voltage is high and the memory cell current does not flow, the readout input node N1 outputs a voltage which is higher than the reference voltage Vref. As a result, by the comparator circuit 103, it is judged whether the voltage of the readout input node N1 is higher or lower than the reference voltage Vref, thereby the size of the threshold voltage of the memory cell is judged.

In a readout input node N1 as mentioned above, when the current supply capacity of the load circuit 102 is large with respect to the memory cell current, i.e., the bit line current, the voltage difference, which is output to the readout input node N1, between the voltage when the memory cell current is large and the voltage when the memory cell current is small becomes small, causing difficulty in reading data at high speed.

Accordingly, the current supply capacity of the load circuit cannot be too large. This means when the bit line capacity is large, it takes time to attain a bit line voltage preferable for readout causing the memory cell readout time being longer. However, because of the large capacity of semiconductor memory devices and the restrictions of their production costs by suppressing division of the memory array in the bit line direction, the bit line becomes long, and its capacity becomes large accordingly, therefore, there is a demand for a readout circuit which can conduct memory cell readout operations at a high speed, even when the bit line capacity is large. To solve this problem, a bit line charge circuit (hereinafter, referred to as precharge circuit) is proposed.

FIG. 16 shows an example of a memory cell readout circuit including a precharge circuit disclosed in JP-A 2000-311493. In FIG. 16, a memory cell readout circuit 110 comprises a feedback-type bias circuit 111, a load circuit 112, and a precharge circuit 113. By the way, for simplicity of explanations, only one of memory cells 115 in a memory cell is shown therein.

The operation principle of the memory cell readout circuit 110 is that a bit line BL is charged at a high speed by the precharge circuit 113 which has a sufficiently larger current supply capacity than that of the load circuit 112, and when the bit line is charged up to a certain voltage, the operation of the precharge circuit 113 is stopped, and by the load circuit 112 and the feedback-type bias circuit 111, changes of the memory cell current are converted into voltage changes in the readout input node N1, and in a comparator circuit 114, the voltage changes are compared with the reference voltage Vref, and readout operations are carried out. In the circuit example in FIG. 16, by a pulse signal which is generated on the basis of a timing signal generated by an address transition detection circuit and the like (ATDP signal), the activation period (precharge period) of the precharge circuit 113 is determined, and by the feedback bias circuit 111, the hold voltage of the bit line BL is determined. FIG. 17 shows an example of a circuit which generates an ATDP signal.

FIG. 18 shows an example of a readout circuit of the same concept as that in FIG. 16. A readout circuit 120 in FIG. 18 has a same circuit configuration as the readout circuit 100 in FIG. 15 except that it is equipped with a precharge circuit 121 which works only for a predetermined precharge period. The difference between the readout circuit 120 in FIG. 18 and the readout circuit 110 in FIG. 16 is the circuit characteristic of the feedback-type bias circuit 101. The output change ratio of the gate voltage of a transfer gate 106 comprising an N-type MOSFET to the voltage of the node N2 appears larger in the feedback-type bias circuit 101 in FIG. 18. Accordingly, the behaviors of the transfer gate 117 to the voltage of the node N2 in the readout circuit 110 in FIG. 16 correspond to that of the transfer gate 106 to the voltage of the node N2 in the readout circuit 120 in FIG. 18. The readout circuit 120 in FIG. 18, in the same manner as the readout circuit 110 in FIG. 16, carries out charging operations, up to a bit line hold voltage which is determined by the feedback-type bias circuit 101, while the precharge signal PRC of the precharge circuit 121 is at an "H" (high) level (for precharge period).

With reference to FIG. 18, suppose the operations of the N-type MOSFET of the transfer gate 106 of the feedback-type bias circuit 101. Suppose the state when bill line is charged up to the bit line hold voltage by the precharge circuit 121. When the precharge signal PRC is maintained at an "H" level after charging up to the bit line hold voltage by the precharge circuit 121, the precharge circuit 121 does not carry out the charge operations of the bit line BL. This is because when the node N2 which has the same potential as the bit line BL, is charged up to the bit line hold voltage, the voltage of the node N3 of the feedback-type bias circuit 101 reaches a certain level, and that voltage level turns an N-type MOSFET 122 of the precharge circuit 121 into an OFF state. As a result, though the precharge signal PRC is at an "H" level, the charge operations of the bit line BL by the precharge circuit 121 stop, and the bit line BL is not charged up to the bit line hold voltage or higher. Because the node N3 is connected to a gate electrode of the transfer gate 106, the transfer gate 106 is also turned OFF. Strictly speaking, in the charge route of the precharge circuit 121, there exists ON resistance of an N-type MOSFET 123 to whose gate the precharge signal PRC is input, therefore the voltage between the gate and the source of the N-type MOSFET 122 of the precharge circuit 121 is different from the voltage between the gate and the source of the transfer gate 106 of the feedback-type bias circuit 101, and conditions are slightly difference between the OFF state of the N-type MOSFET 122 and the OFF state of the transfer gate 106, nevertheless, the transfer gate 106 is in an OFF state.

This state is the state where the charge of the bit line BL is completed. When the operation of the precharge circuit 121 is stopped, in the case when the threshold voltage of the memory cell selected by the bit line selection transistor 105 is low, and in the case when the word line connected to the memory cell is selected, the charge level of the bit line BL is lowered by the memory cell voltage. Namely, the voltage of the node N2 falls. As the voltage of the node N2 falls, the voltage of the node N3 which is the gate input of the transfer gate 106 rises, and the transfer gate 106 shifts from an OFF state to an ON state. As a result, the readout input node N1 changes into the voltage which is determined by the current which flows when the transfer gate 106 is turned into an ON state, and the load current that the load circuit 102 flows. As an example of the load circuit 102, as shown in FIG. 19, there is a load circuit which uses a P-type MOSFET which uses a predetermined bias voltage as gate voltage.

Next, how the voltage of the readout input node N1 is determined by the cell current which changes according to the difference of the threshold voltage of the memory cell and the load current of the load circuit 102 will be described with reference to FIG. 20. In FIG. 20, the current-voltage characteristic of the load circuit using the P-type MOSFET is shown in (a), and the current-voltage characteristic in the state where the transfer gate 106 is in an ON state (the state where the threshold voltage of the memory cell is low, and the cell current is large) is shown in (b), and the current-voltage characteristic in the state where the transfer gate 106 is roughly in an OFF state (the state where the threshold voltage of the memory cell is high, and the cell current is small) is shown in (c). The DC voltage VN1L of the readout input node N1 in the case when the threshold voltage of the memory cell determined by the characteristic (a) and the characteristic (b) is low, is given by the voltage value at the cross point of the characteristic (a) and the characteristic (b). Therefore, when the threshold voltage of the selected memory cell is low, the readout input node N1 shifts from the level at completion of precharge of the bit line BL to the voltage VN1L.

On the other hand, when the threshold voltage of the selected memory cell is high, the current which flows from the bit line BL to the memory cell is small, and the voltage level of the node N2 hardly falls, and the transfer gate 106 remains in an almost OFF state (or in a slightly ON state). The DC voltage VN1H of the readout input node N1 in the case when the threshold voltage of the memory cell determined by the characteristic (a) and the characteristic (c) is high, is given by the voltage value at the cross point of the characteristic (a) and the characteristic (c). Therefore, when the threshold voltage of the selected memory cell is high, the readout input node N1 shifts from the level at completion of precharge of the bit line BL to the voltage VN1H. As shown in FIG. 20, when the current-voltage characteristic of the load circuit 102 is characterized as shown in (a) of FIG. 20, the readout input node N1 appropriately changes according to the threshold voltage of the memory cell.

In the DC load circuit using such a P-type MOSFET as shown in FIG. 19, though the bit line charge is complete, the operation of the precharge circuit 121 is continued. The voltage of the bit line BL is maintained at the bit line hold voltage, but, because the transfer gate 106 of the feedback-type bias circuit 101 is in a roughly OFF state, the readout input node N1 is charged by the load circuit, and the voltage thereof rises higher than the voltage at completion of the bit line charge. If the transfer gate 106 is being OFF state for a long time after the precharge circuit 121 starts operating and the bit line charge is complete, the voltage of the readout input node N1 rises to the maximum power source voltage. Thereafter, the operation of the precharge circuit is stopped, and when the threshold voltage of the selected memory cell is low and the bit line current starts flowing according to the memory cell condition, the voltage of the readout input node N1 changes to the voltage VN1L. However, once the voltage of the readout input node N1 rises near the power source voltage, in some cases, the readout input node N1 does not change rapidly to the voltage VN1L. For example, in a large capacity memory, the bit line length is long so as to make the chip size small, as a result, its bit line resistance and bit line capacity become large. Accordingly, even when the transfer gate 106 is turned into an ON state, because the bit line resistance and the bit line capacity are large, it takes time to shift to the voltage VN1L.

In FIGS. 21 and 22, examples of the comparators 103 are shown. In FIG. 21, a differential amplifier using an N-type MOSFET as an input device is used as a comparator circuit, while in FIG. 22, a differential amplifier using a P-type MOSFET as an input device is used as a comparator circuit. In both comparators in FIGS. 21 and 22, when the input voltage is input near the power source voltage, even if there is a voltage difference between the reference voltage Vref and the voltage of the readout input node N1, output is not carried out at a high speed. For example, in FIG. 21, because the voltage between the gate and the source of the N-type MOSFET at the input stage is too large, the amplification ratio falls. Further, in FIG. 22, the gate source voltage of the P-type MOSFET at the input stage becomes below the threshold voltage, and the P-type MOSFET becomes an OFF state. As for the bias in FIGS. 21 and 22, the voltage value is not necessarily the same, and is different from the voltage value of the bias of the load circuit in FIG. 19.

In order to make the output of the comparator circuit 103 shown in FIG. 18 carried out at high speed, the input voltage of the comparator circuit 103 needs to be at optimized voltage with which comparator circuits can operate at high speed. However, in the readout circuit 120 in FIG. 18, after completion of the charge of the bit line BL, if the operation of the comparator circuit 103 is continued, the voltage of the readout input node N1 will rise by the load circuit 102. In order to make the readout input node N1 at he optimized voltage for the comparator circuit 103, after completion of the charge of the bit line, when the readout input node N1 reaches the optimized voltage, the operation of the precharge circuit 121 may be stopped. For example, when the operation timing of the precharge circuit 121 is stopped by a pulse signal ATDP generated by an inverter delay circuit or the like on the basis of the signal generated by an address transition detection circuit shown in FIG. 17, it has been difficult to realize an appropriate timing in consideration for the operation voltage range, the operation temperature range and fluctuations in manufacturing processes. This is because there is no causal relationship between the increase in voltage of the readout input node N1 and the pulse signal ATDP of an inverter delay circuit as shown in FIG. 17, and the pulse signal ATDP is not a signal which stops the operation of the precharge circuit 121 even when the readout input node N1 reaches a predetermined voltage.

A method to solve the above problem is disclosed in FIG. 3 of JP-A 2000-311493. The circuit thereof is shown in FIG. 23. A memory cell readout circuit 130 shown in FIG. 23, in comparison with the memory cell readout circuit 110 in FIG. 16, is equipped with a second transfer gate 131 comprising an N-type MOSFET which short-circuits between the readout input node N1 and a gate node N3 of a transfer gate 117 of a feedback-type bias circuit 111. After completion of the bit line charge, even when the voltage of the readout input node N1 starts rising, while an EQL signal is at an "H" level, the voltage of the gate node N3 of the transfer gate 117 is forcibly increased by the second transfer gate 131, and the transfer gate 117 is turned into an ON state, thereby unnecessary voltage increase of the readout input node N1 is prevented. However, in this method using the EQL signal, if the pulse width of the EQL signal is too short, a pulse itself may disappear owing to the resistance and capacity of wires and the like, and if the pulse width is long, readout time may become long accordingly.

SUMMARY OF THE INVENTION

The present invention has been made in view of the above problems, and it is therefore an object of the invention to provide a semiconductor readout circuit capable of effectively reading out memory cell data at a high speed even in the case where capacity and resistance of a bit line are large.

According to a first aspect of the present invention, a semiconductor readout circuit comprises: a precharge circuit which charges a bit line connected to a memory cell to a predetermined precharge voltage before reading out information stored in the memory cell; a feedback-type bias circuit which controls a voltage of the bit line so as to be a predetermined voltage; a sense amplifier which amplifies and detects a voltage change in a readout input node connected to the bit line via a transfer gate of the feedback-type bias circuit; and a load circuit which charges the readout input node. The load circuit is made inactive for a fixed period at least immediately before termination of a precharge period where the precharge circuit is active, and the load circuit is, then, made active after termination of the precharge period.

Herein, the precharge circuit and the feedback-type bias circuit are not necessarily connected directly to the bit line. For example, in a configuration that a node, which is directly connected to the precharge circuit and the feedback-type bias circuit, is connected to plural bit lines via plural bit line selecting MOSFETs for selecting one bit line from among the plural bit lines, a circuit configuration according to the first aspect includes the following configurations: the precharge circuit charges the bit lines via the node and the bit line selecting MOSFETs, and the feedback-type bias circuit controls the voltage of the bit lines via the node and the bit line selecting MOSFETs. Therefore, one end of the transfer gate of the feedback-type bias circuit is the readout input node, while the other end thereof is a node that the precharge circuit directly charges, and the node is connected to the bit lines via the bit line selecting MOSFETs.

According to the semiconductor readout circuit of the present invention, even in the case where the precharge period is continued even after completion of charging of the bit lines, start of a period when the load circuit is made inactive is set to at latest upon or in the vicinity of a time when the charging of the bit lines is completed, so that the readout input node can be prevented from being charged to an unnecessarily high voltage from the level upon completion of the charging of the bit lines. If the precharge period is completed before or after a timing when the word line selects a memory cell to be read out and, then, a cell current of the memory cell, i.e., a bit line current is flown out via the selected bit line, the load circuit is made active at the same timing, so that it is possible to shift to the voltage of the readout input node according to the cell current corresponding to the memory state of the memory cell at a high speed.

According to a second aspect of the present invention, in the semiconductor readout circuit, the sense amplifier is constituted of a comparator circuit which has a voltage of the readout input node and a predetermined reference voltage as differential inputs. Further, the semiconductor readout circuit comprises a reference voltage generation circuit which generates the reference voltage. The reference voltage generation circuit includes: a reference load circuit having the same circuit configuration as that of the load circuit; a reference precharge circuit having the same circuit configuration as that of the precharge circuit; a reference feedback-type bias circuit having the same circuit configuration as that of the feedback-type bias circuit; and a reference cell having the same element structure as that of the memory cell.

According to the second aspect of the present invention, when the reference cell is set to have an intermediate current within a fluctuation range of the cell current of the memory cell, the reference voltage can be set to have an intermediate voltage value within a fluctuation range of the voltage of the readout input node. In addition, when the comparator circuit compares the reference voltage with the voltage of the readout input node as differential inputs, it is possible to reliably perform a readout operation of a memory cell corresponding to an amount of cell currents of the memory cell at a high speed. In particular, when the reference voltage generation circuit is designed to have the same configuration as those of the circuits in a readout system from a charge circuit to a memory cell, an operation margin can be maintained widely because the reference voltage and the voltage of the readout input node change according to changes in an operation voltage, an operation temperature, variation of a manufacturing process and the like.

More specifically, in the semiconductor readout circuit according to the second aspect of the present invention, preferably, the reference voltage generation circuit is constituted of a pair of a first reference voltage generation circuit in which a cell current of the reference cell is set to a cell current corresponding to one memory state of the memory cell and a second reference voltage generation circuit in which the cell current of the reference cell is set to a cell current corresponding to another memory state of the memory cell, and a first reference voltage generated from the first reference voltage generation circuit and a second reference voltage generated from the second reference voltage generation circuit are input in parallel with each other on one side of the differential inputs of the comparator circuit. With this configuration, the first reference voltage and the second reference voltage reflect two voltage values corresponding to memory states of the memory cell. Therefore, when both reference voltages are input in parallel with each other to one side of the differential inputs of the comparator circuit, the reference cell can be substantially set to have an intermediate current within a fluctuation range of the cell current of the memory cell, so that working effects in the second aspect can be exhibited. In addition, since cell currents of two reference cells can be set in the same manner as in cell currents of the respective memory cells, the reference cell can have the same setting conditions as programming conditions of a normal memory cell; therefore, it is unnecessary to provide a special setting condition.

According to a third aspect of the present invention, the semiconductor readout circuit according to the first or second aspect further comprises a hold circuit which holds the voltage of the readout input node at a predetermined hold voltage during, at least, the load circuit is inactive. According to the third aspect of the present invention, the voltage of the readout input node in a period before the bit line current flows and the memory cell readout starts after completion of charging of the bit line, can be set at an optimal level for operations of the sense amplifier at the subsequent stage thereof. As a consequence, after the bit line current starts flowing, the sense amplifier can carry out a high speed output operation according to voltage changes of the readout input node corresponding to an amount of cell currents.

In the semiconductor readout circuit according to the third aspect of the present invention, preferably, the hold circuit includes an N-type MOSFET where a source connected to the readout input node, a drain connected to a power supply voltage, and a gate connected to a predetermined intermediate voltage for determining the hold voltage. More preferably, the intermediate voltage is supplied from an internal node of the feedback-type bias circuit or the intermediate voltage is determined by a circuit constant in the feedback-type bias circuit as an intermediate voltage between the gate voltage of the transfer gate from the internal node in the feedback-type bias circuit and the power supply voltage. With this configuration, the hold voltage of the readout input node can be adjusted by adjusting the intermediate voltage.

According to a fourth aspect of the present invention in the semiconductor readout circuit according to any of the first to third aspects of the present invention, the load circuit is constituted by use of a P-type MOSFET capable of controlling an amount of currents supplied from the load circuit by the bias voltage input to the gate, and the bias voltage is adjusted so that the amount of currents of the P-type MOSFET is within a range of a memory cell current which changes according to the information stored in the memory cell.

According to the fourth aspect of the present invention, since the amount of currents of the P-type MOSFET is within a range of the memory cell currents, when the bit line current flows and the load circuit is made active, an amount of load currents of the lord circuit does not excessively become large or small with respect to the memory cell current, so that the voltage of the readout input node can promptly shift to a voltage value according to an amount of memory cell currents. Thus, the above configuration contributes to a high-speed readout operation of the sense amplifier.

Preferably, the semiconductor readout circuit according to the fourth aspect of the present invention comprises a bias voltage generation circuit which generates the bias voltage, the bias voltage generation circuit includes: a bias voltage generating reference cell; and a second load circuit which flows the same amount of load currents as that of cell currents of the bias voltage generating reference cell, and can control an amount of load currents of the load circuit according to the amount of load currents, and the cell current of the bias voltage generating reference cell is set at an intermediate level between two cell currents corresponding to each memory states of the memory cell. According to this configuration, the bias voltage is adjusted so that the amount of currents of the P-type MOSFET is within the range of the memory cell current which changes according to the information stored in the memory cell; thus, working effects according to the fourth aspect can be specifically exhibited.

According to a fifth aspect of the present invention, the semiconductor readout circuit according to the any of the above aspects further comprises a precharge signal generation circuit which generates a precharge signal for making the precharge circuit active, the precharge signal generation circuit includes: a dummy bit line which simulates the bit line; a dummy precharge circuit which can charge the dummy bit line by the same charge current as that of the precharge circuit to the same charge voltage; a dummy feedback-type bias circuit which has the same circuit configuration as that of the feedback-type bias circuit for controlling a voltage of the dummy bit line so as to be a predetermined voltage; and a dummy load circuit which can charge a dummy readout input node connected to the dummy bit line via a transfer gate of the dummy feedback-type bias circuit by the same charge current as that of the load circuit. The precharge signal generation circuit detects a charge state of the dummy bit line and stops generating the precharge signal on the basis of the voltage of the dummy readout input node.

According to the fifth aspect of the present invention, when the dummy bit line is structured by suitably simulating parasitic capacity or parasitic resistance of the bit line, the following effects can be exhibited: a charging state of the bit line can be monitored by a change in voltage of the dummy bit line, termination of the precharge period when the precharge circuit is active can be automatically set at a completion timing of charging of the bit line, and a memory cell readout operation can be promptly performed after completion of charging of the bit line. Consequently, it is possible to promote a high-speed readout operation of a voltage of the readout input node by the sense amplifier. Basically, parasitic capacity and parasitic resistance of a dummy bit line is equivalent to those of the bit line. However, when the timing adjustment of the precharge period is needed, by adjusting the parasitic capacity and parasitic resistance of the dummy bit line, i.e., the length of the dummy bit line and the number of dummy memory cells to be connected, the timing can be adjusted.

DESCRIPTION OF PREFERRED EMBODIMENTS

An embodiment of a semiconductor readout circuit according to the present invention (hereinafter, referred to as "inventive circuit") will be described with reference to the drawings.

Figure 1:
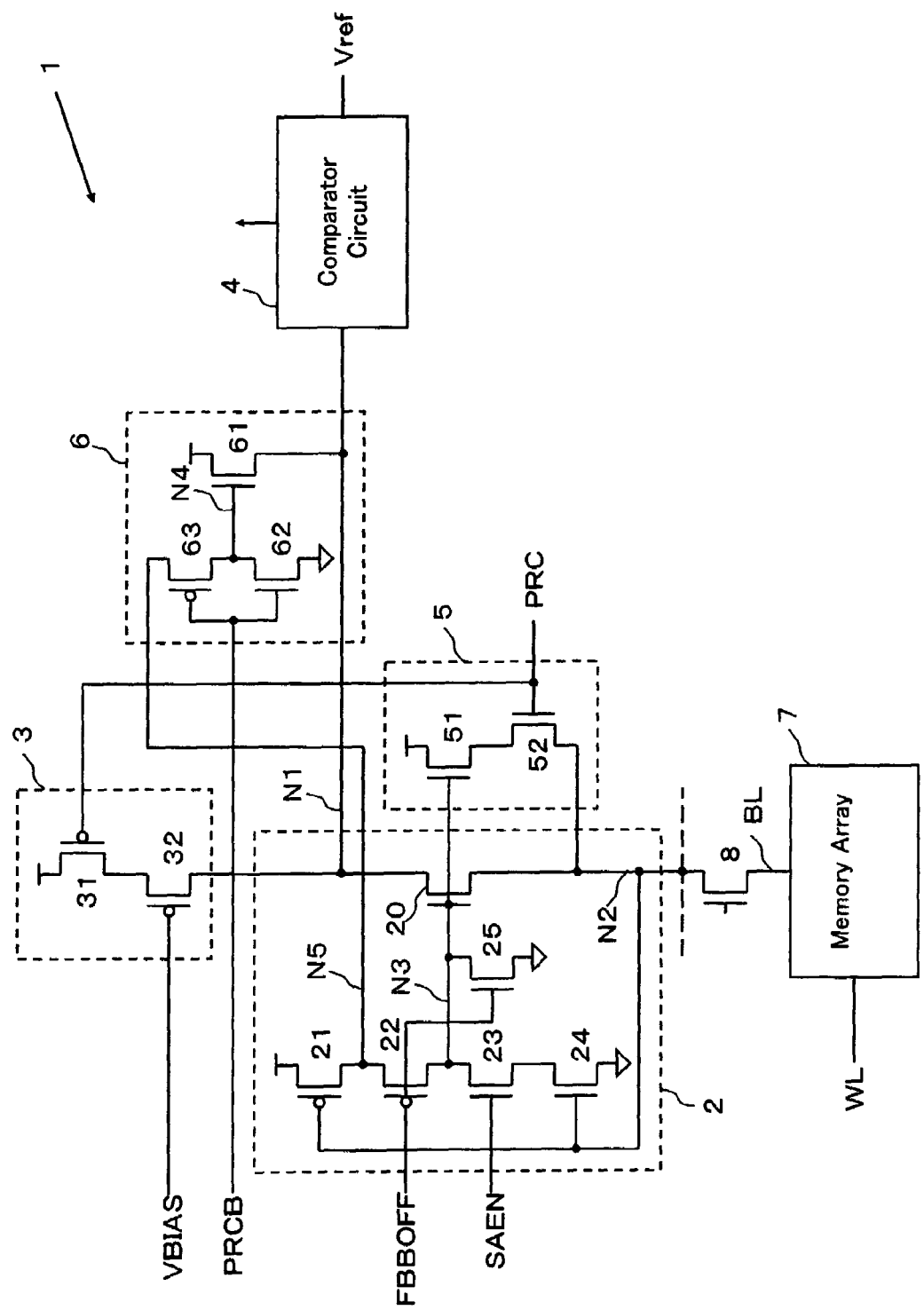
FIG. 1 is a circuit diagram showing a circuit configuration of an embodiment of a semiconductor readout circuit according to the present invention.

FIG. 1 is a circuit diagram showing a circuit configuration of an inventive circuit 1. The inventive circuit 1 comprises a feedback-type bias circuit 2, a load circuit 3, a comparator circuit 4, a precharge circuit 5, and a hold circuit 6 of a readout input node N1. In this embodiment, a memory array 7 has a structure in that memory cells are arranged in an array form. However, FIG. 1 shows for simplifying the figure one word line WL and one bit line BL for selecting a memory cell to be read out in the memory array 7. Therefore, the inventive circuit 1 may be a flash memory wherein memory cells in the memory array 7 are flash memory cells, and a flash memory may be used as a semiconductor device that includes the inventive circuit 1.

Hereinafter, configurations and functions of the respective circuits will be described.

The feedback-type bias circuit 2 is structured so as to control a node N2 connected to the bit line BL via a bit line selection transistor 8 comprising an N-type MOSFET (hereinafter, referred to as NMOS) at a predetermined voltage, and control the voltage of the indirectly selected bit line BL at the predetermined voltage. More specifically, the feedback-type bias circuit is equipped with a transfer gate 20 having an NMOS whose drain is connected to the readout input node N1 connected to one side of differential inputs of the comparator circuit 4, source is connected to the node N2, and gate is connected to an internal node N3, a series circuit of two P-type MOSFETs (hereinafter, referred to as PMOS)

21 and 22 arranged between the power source voltage (power source line) and an internal node N3, and a series circuit of two NMOSs 23 and 24 arranged between the internal node N3 and a GND voltage (ground line). In the PMOS 21, the source thereof is connected to the power source voltage, the drain is connected to the source of the other PMOS 22, and the gate is connected to the node N2, while in the PMOS 22, the source thereof is connected to the drain of the PMOS 21, the drain is connected to the internal node N3, and the gate is connected to a control signal FBBOFF, and in the NMOS 23, the drain thereof is connected to the internal node N3, the source is connected to the drain of the other NMOS 24, and the gate is connected to a control signal SAEN, while in the other NMOS 24, the drain thereof is connected to the source of the NMOS 23, the source is connected to the GND voltage (ground line), and the gate is connected to the node N2. Further, an NMOS 25 is arranged wherein a gate that fixes the internal node N3 to GND voltage when the feedback-type bias circuit 2 is OFF is connected to the control signal FBBOFF.

The load circuit 3 is a circuit that charges the readout input node N1 with a predetermined load current (charge current), and includes a series circuit of PMOSs 31 and 32 arranged between the power source voltage (power source line) and the readout input node N1. In the PMOS 31, the source thereof is connected to the power source voltage (power source line), the drain is connected to the source of the PMOS 32, and the gate is connected to a precharge signal PRC to be described later herein, and in the PMOS 32, the source thereof is connected to the drain of the PMOS 31, the drain is connected to the readout input node N1, and the drain is connected to a predetermined bias voltage VBIAS.

Figure 21:
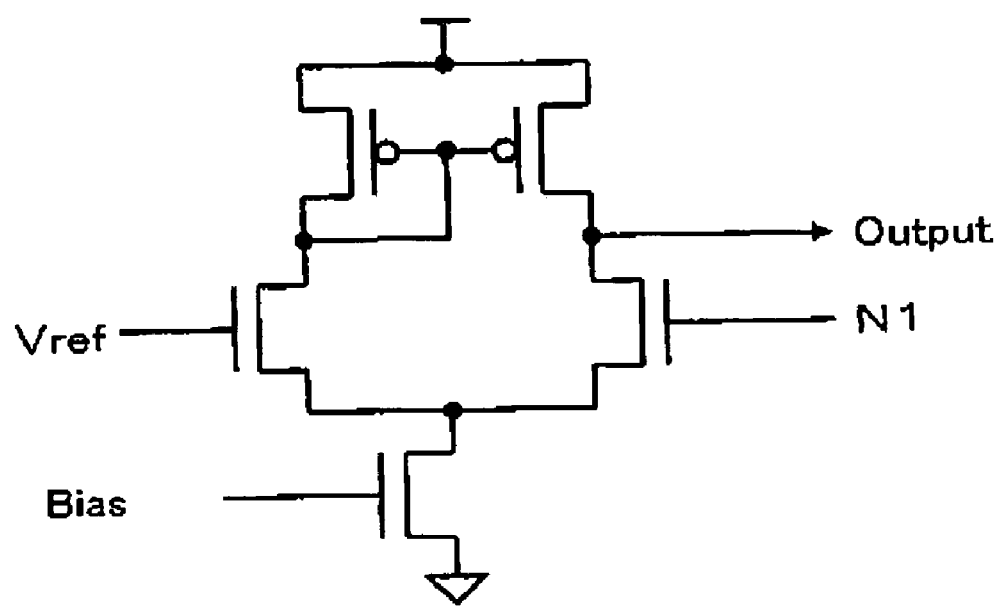
FIG. 21 is a circuit diagram showing a circuit configuration of a comparator circuit.
Figure 22:
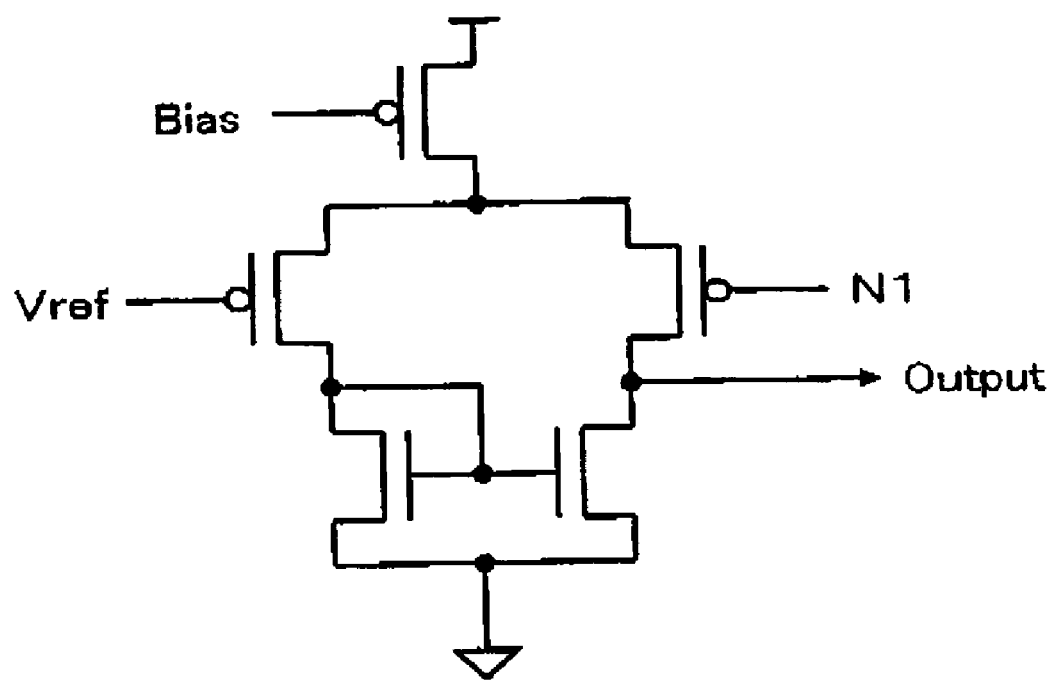
FIG. 22 is a circuit diagram showing another circuit configuration of the comparator circuit.
Figure 23:
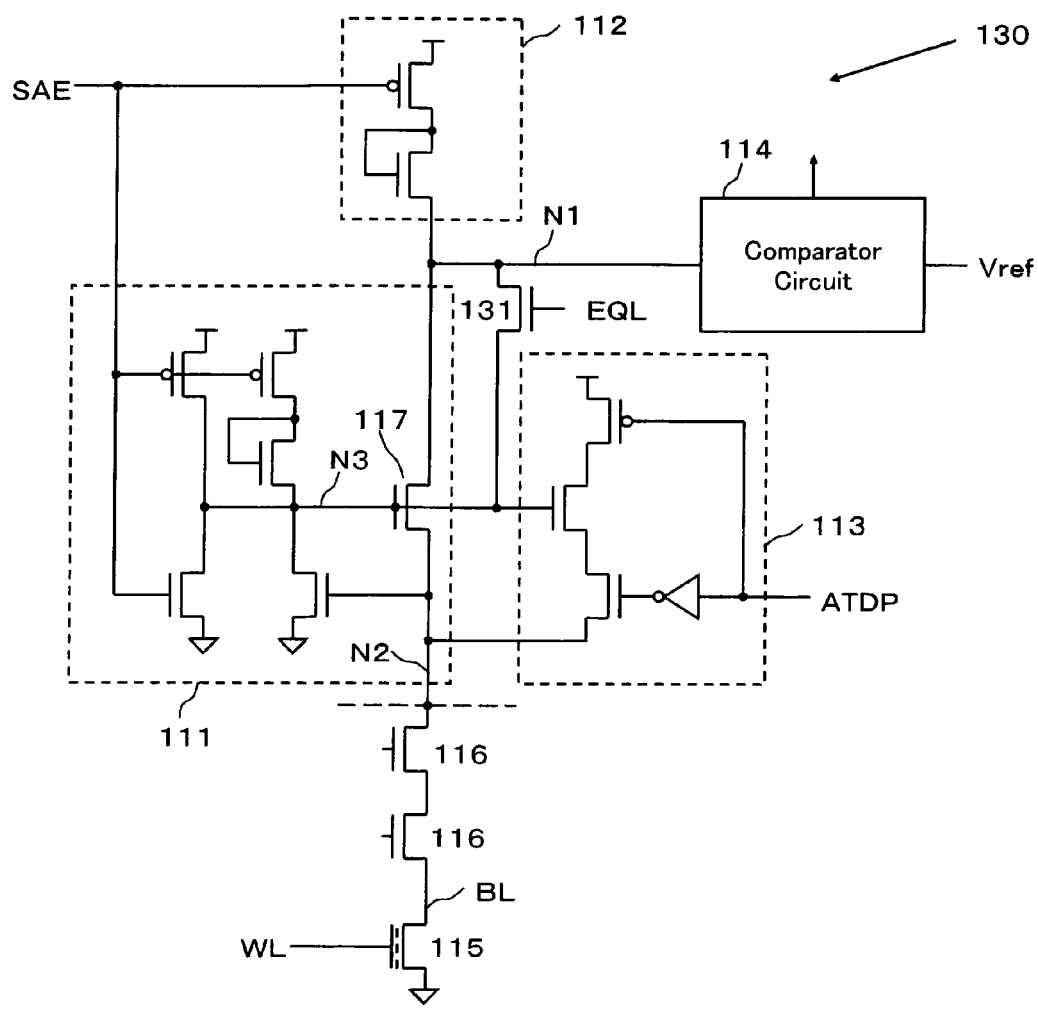
FIG. 23 is a block diagram showing yet another circuit configuration of the conventional semiconductor readout circuit.

The comparator circuit 4 functions as a sense amplifier that compares the voltage of the readout input node N1 with a predetermined reference voltage Vref, and thereby amplifies and detects voltage changes of the readout input node N1. As for its concrete circuit configuration, for example, already known circuit configurations as shown in FIGS. 21, 22 and the like may be employed.

The precharge circuit 5 is structured to control the node N2 that connects via the bit line selection transistor 8 to the bit line BL at a predetermined voltage, and to control the voltage of the indirectly selected bit line BL at the predetermined voltage concerned. In concrete, the precharge circuit is equipped with a series circuit of NMOSs 51 and 52 arranged between the power source voltage (power source line) and the node N2, and in the NOMOS 51, the drain thereof is connected to the power source voltage, the source is connected to the drain of the NMOS 52, and the gate is connected to the internal node N3 of the feedback-type bias circuit 2, while in the NMOS 52, the drain thereof is connected to the source of the NMOS 51, the source is connected to the node N2, and the gate is connected to the precharge signal PRC.

The hold circuit 6 is a circuit that holds the voltage of the readout input node N1 at a predetermined hold voltage while the load circuit 3 is made inactive by the precharge signal PRC, and includes two NMOSs 61 and 62 and a PMOS 63. In the NMOS 61, the drain thereof is connected to the power source voltage, the source is connected to the readout input node N1, and the gate is connected to an internal node N4, while in the NMOS 62, the drain thereof is connected to the internal node N4, the source is connected to the GND voltage (ground line), and the gate is connected to a control signal PRCB of level reversed precharge signal PRC, while in the PMOS 63, the source thereof is connected to an internal node N5 of the feedback-type bias circuit 2 (the connection point of the drain of PMOS 21 and the source of PMOS 22), the drain is connected to the internal node N4, and the gate is connected to the control signal PRCB.

Figure 16:
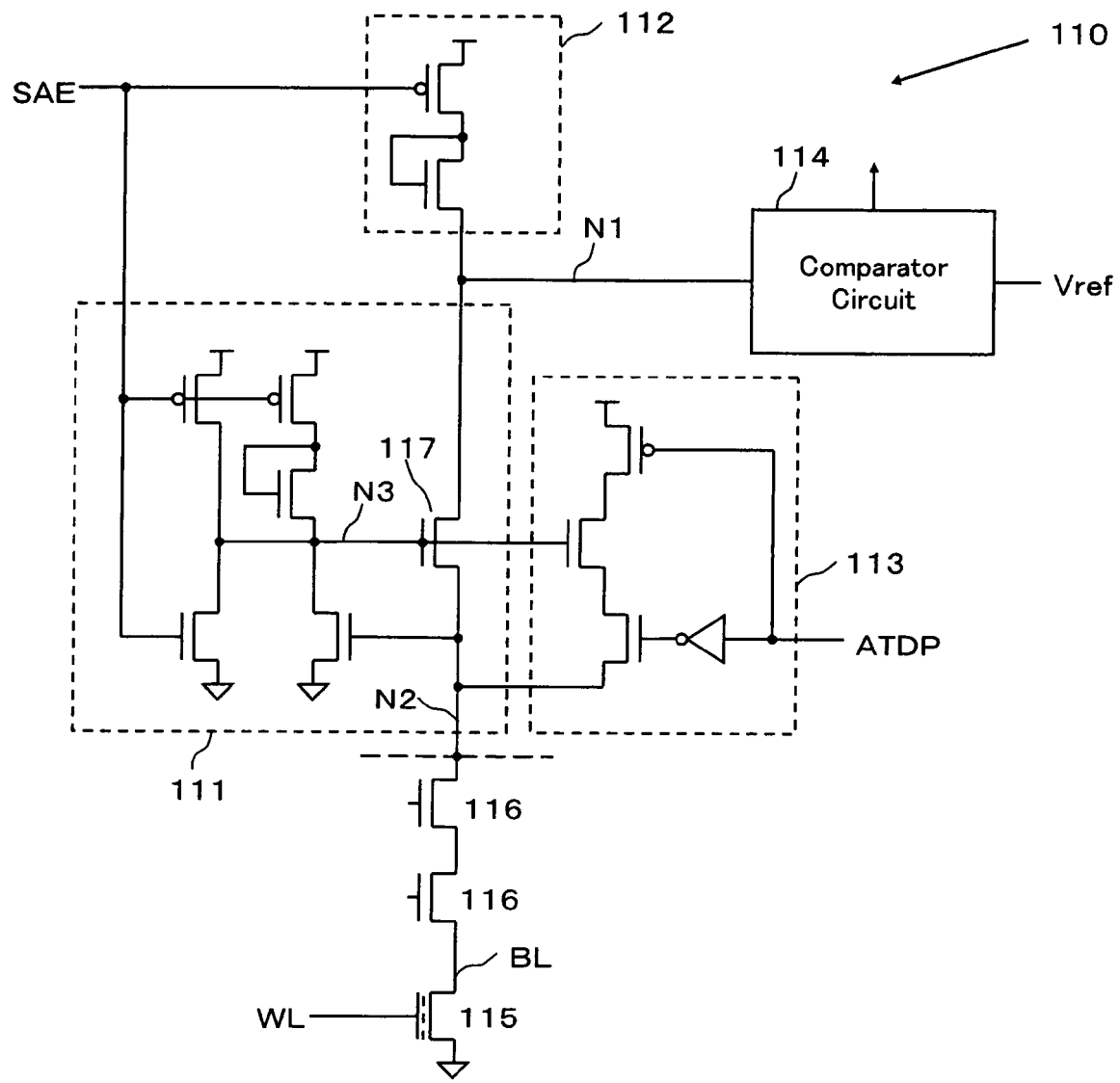
FIG. 16 is a block diagram showing another circuit configuration of the conventional semiconductor readout circuit.
Figure 18:
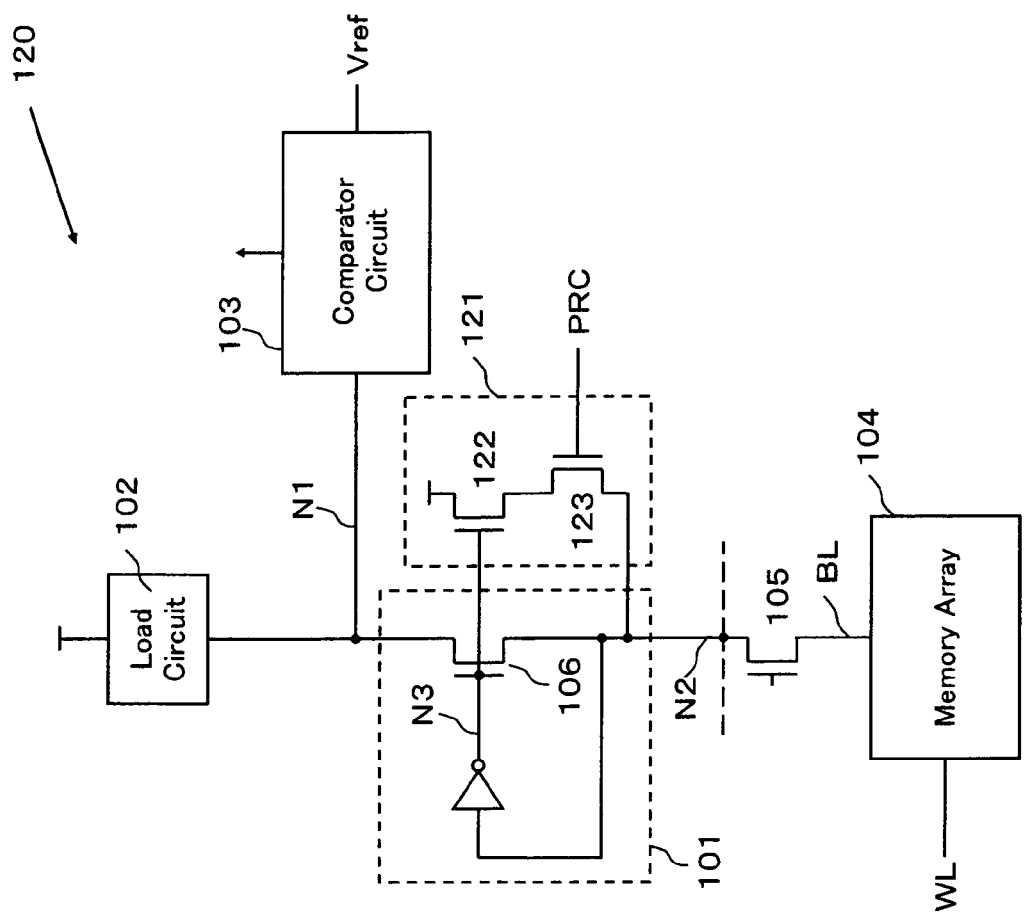
FIG. 18 is a circuit diagram showing still another circuit configuration of the conventional semiconductor readout circuit.
Figure 19:
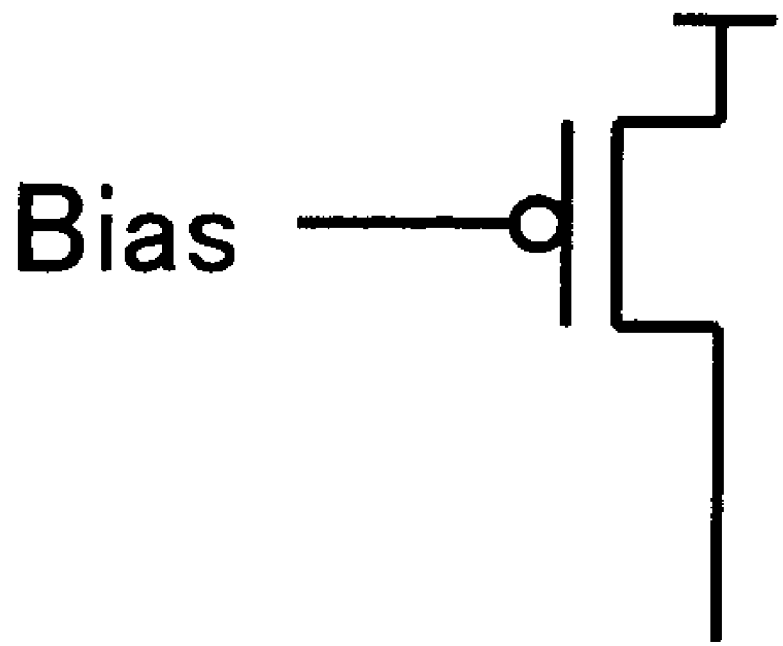
FIG. 19 is a block diagram showing a circuit configuration of a load circuit of the conventional semiconductor readout circuit.
Figure 20:
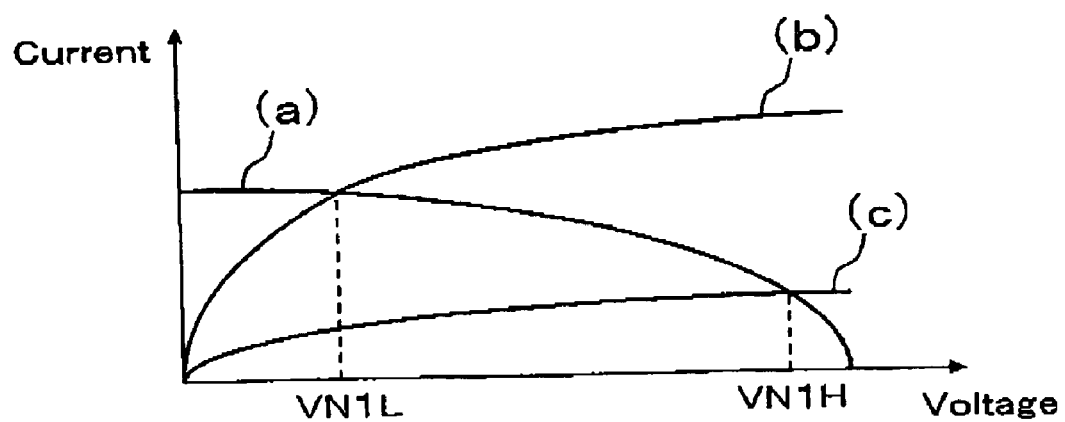
FIG. 20 illustrates current-voltage characteristics of a memory cell and current-voltage characteristics of a load circuit.

Circuit operations of the inventive circuit 1 shown in FIG. 1 will be described in detail hereinafter. It is supposed that the selection of the memory cell to be read out is made by the word line WL and the bit line BL in the same manners as in the conventional readout circuit examples shown in FIGS. 16, 18 and the like, and the operation to charge the selected bit line BL by the precharge circuit 5 is same in the conventional circuit examples, and the bit line BL before the start of charge is at the GND level.

Figure 2:
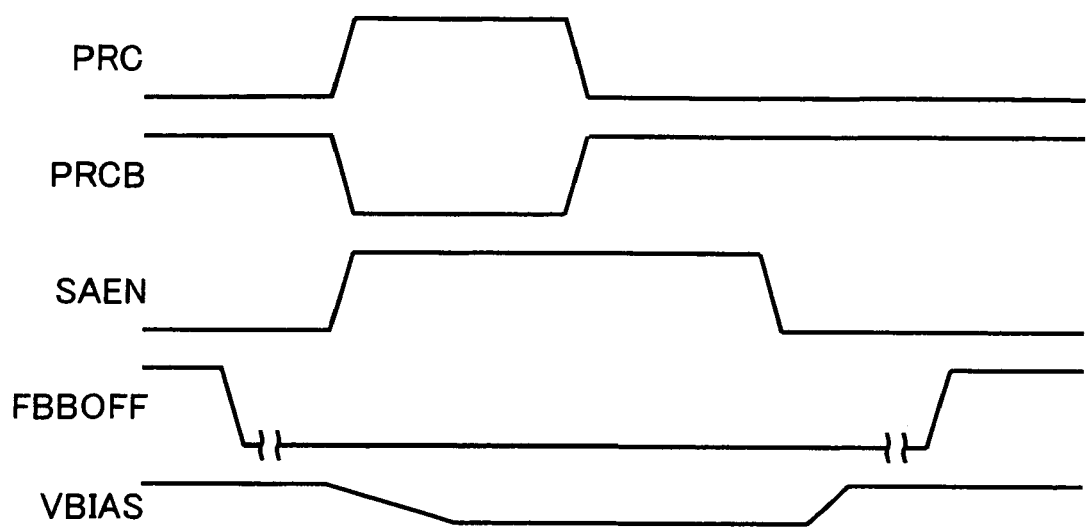
FIG. 2 is a timing chart showing a timing relation of a precharge signal and various control signals of the semiconductor readout circuit according to the present invention.
Figure 17:
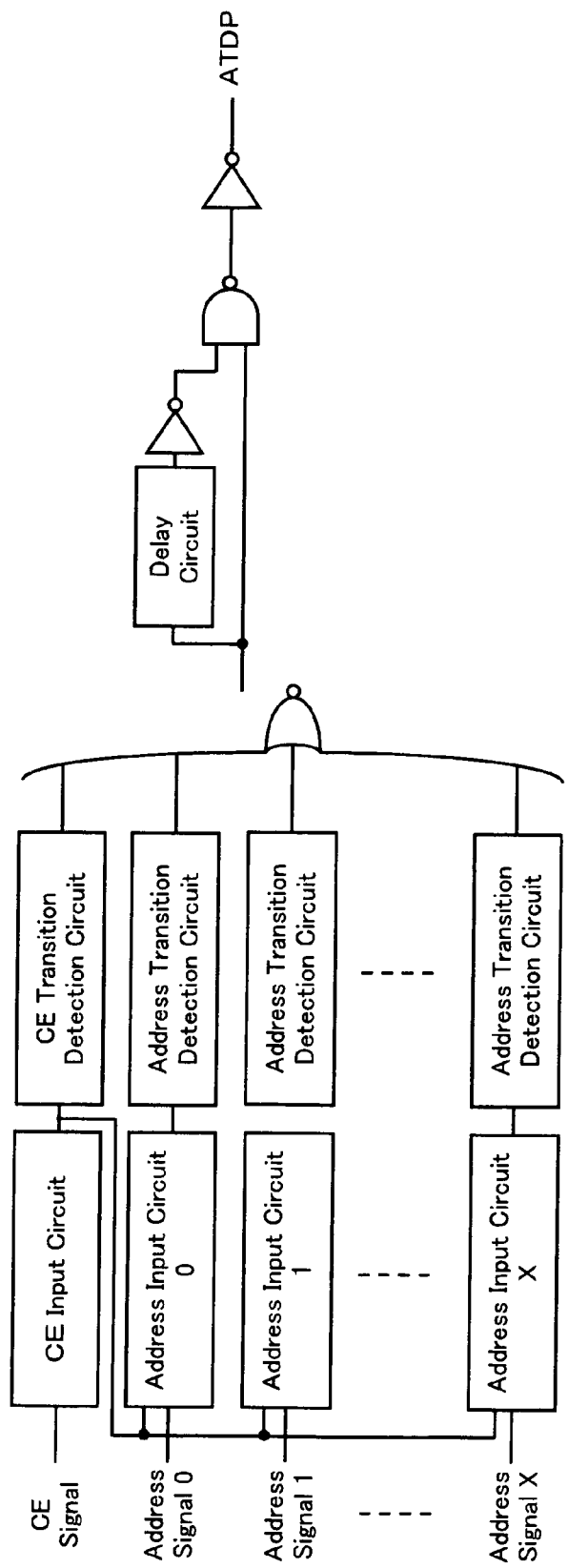
FIG. 17 is a circuit diagram showing a pulse signal generation circuit for determining a precharge period in the conventional semiconductor readout circuit.

The charge of the bit line BL by the precharge circuit 5 is started by the rise of the precharge signal PRC. The precharge period when the precharge circuit 5 is made active is determined by the "H" level period of the precharge signal PRC. The precharge signal PRC is same as the ATDP signal in the conventional example in FIG. 16, and is the same signal as a pulse signal that is generated on the basis of a signal generated by an address transition detection circuit or the like, for example, the ATDP signal shown in FIG. 17. The relation of the precharge signal PRC and other input signal is supposed to be the relation of the timing chart shown in FIG. 2. While the input signal FBBOFF of the feedback-type bias circuit 2 is at a "L" level, and the other input signal SAEN is at an "H" level, the feedback-type bias circuit 2 is made active, and judges the size of the threshold voltage corresponding to memory cell readout, i.e., memory cell memory conditions.

Before the start of the charge of the bit line BL, the bit line BL is at its GND level, the voltage of the node N2 whose voltage level changes following to the bit line is also at its GND level. Accordingly, the internal node N3 of the feedback-type bias circuit 2 becomes an "H" level. As a result, the NMOS 51 of the precharge circuit 5 is in an ON state. At the same time when the precharge signal PRC changes from a "L" level to an "H" level, the respective control signals shown in FIG. 2 change too. The NMOS 52 of the precharge circuit 5 is turned into an ON state, and the charge of the bit line BL is started. At the start of the charge, the transfer gate 20 of the feedback-type bias circuit 2 is also in an ON state. Because the load circuit 3 is in an inactive state, the charge from the load circuit 3 to the readout input node N1 is not carried out. As for the readout input node N1, the voltage of the node N5 is high, and the charge from the hold circuit 6 is carried out, but for the period when the voltage of the node N2 is lower than that of the readout input node N1, the transfer gate 20 is in an ON state, there is no influence of the charge from the hold circuit 6 to the readout input node N1, and the voltage of the readout input node N1 will not rise unnecessarily.

Next, the state where the bit line BL is completely charged. When the bit line BL is quickly charged by the precharge circuit 5, and the bit line BL is charged up to a voltage level necessary for memory cell readout, if the "H" level of the precharge signal PRC continues, the precharge circuit 5 is maintained at an active state. However, when the bit line BL is charged up to the voltage level necessary for memory cell readout by the feedback-type bias circuit 2, the level of the node N3 falls, and the transfer gate 20 and the NMOS 51 are turned into OFF state, and the charge of the bit line BL is not carried out even when the precharge circuit 5 is in an active state. On the other hand, as for the readout input node N1, along the rise of the node N2, the voltage of the node N5 falls from the start of the charge, as a result, the voltage is held at the voltage that is determined by the voltage of the node N4 of the hold circuit 6 and the NMOS

61. The NMOS 61 is an NMOS, and the voltage of the node N4 is input to the gate thereof, and the charge by the hold circuit 6 is not carried out over the voltage that is determined from this relation. And, because the load circuit 3 is in an inactive state while the precharge signal PRC is at an "H" level, the charge to the readout input node N1 by the load circuit 3 is not carried out. As a result, the readout input node N1 is held at the voltage that is determined by the hold circuit 6. This state does not change even if the precharge signal PRC is maintained at an "H" level after completion of the charge of the bit line.

Next, the case where the precharge signal PRC changes from a "H" level to a "L" level is supposed. At this moment, the hold circuit 6 is turned into an inactive state because the control signal PRCB changes from a "L" level to an "H" level, and stops the charge to the readout input node N1. At the same time, the precharge circuit 5 is also turned into an inactive state. On the other hand, the feedback-type bias circuit 2 is maintained at an active state, and the load circuit 3 is turned into an active state, and starts the charge to the readout input node N1.

Figure 3:
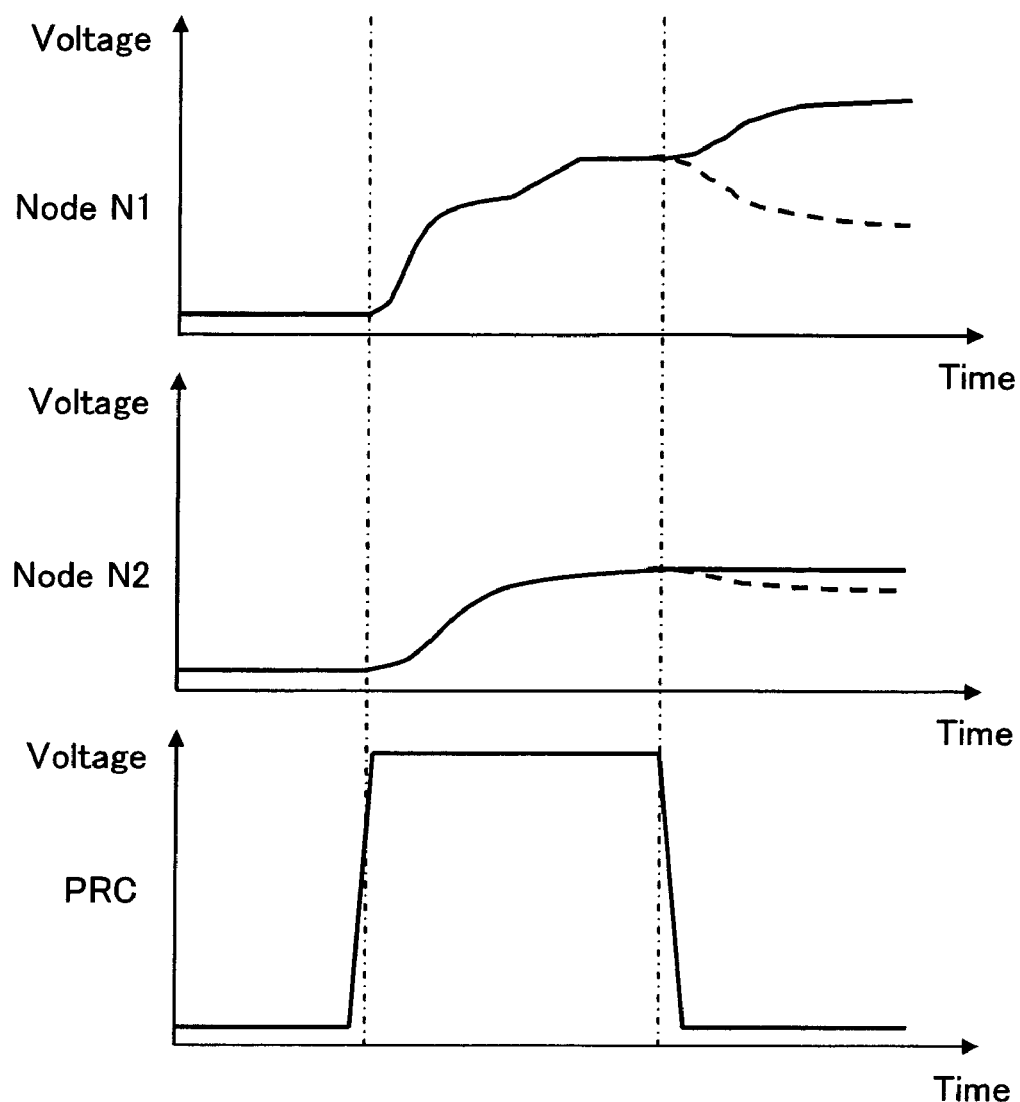
FIG. 3 is a timing chart showing voltage change of an internal node of the semiconductor readout circuit according to the present invention.

When the threshold voltage of the selected memory cell as a readout objective is low, the memory cell works to lower the charge level of the bit line BL, as a result, the voltage level of the node N2 falls, and with the circuit characteristic of the feedback-type bias circuit 2, the voltage of the node N3 rises, and the transfer gate 20 shifts from an OFF state to an ON state, and current flows. The voltage level of the readout input node N1 start shifting to the voltage that is determined by the current from the load circuit 3 and the current flowing to the transfer gate 20. On the other hand, when the threshold voltage of the memory cell is high, the cell current that the memory cell flows is small, and the capacity and resistance of the bit line are large, therefore the voltage level of the node N2 hardly changes from the charge completion level. As a result, the voltage of the node N3 hardly rises, and the transfer gate 20 remains in an OFF state, and the transfer gate 20 scarcely flows current. Thereby, the current from the load circuit 3 becomes charge current exclusively to the readout input node N1, and because the load circuit 3 is structured by a PMOS, and the wire capacity and resistance of the readout input node N1 is smaller than those of the bit line BL, the voltage of the readout input node N1 rises rapidly to the power source voltage. The behaviors of the readout input node N1 change between the case where the threshold voltage of the memory cell is high and the case where that is low, while the start point of the change is the hold voltage that is determined by the hold circuit 6. The readout input node N1 changes with elapse of time from the hold voltage that is determined by the hold circuit, to the voltage that is determined by the cell current that changes with the threshold voltage and the load current that the load circuit 3 flows. By setting the hold voltage set by the hold circuit 6 of the readout input node N1 at the input voltage level at which the comparator circuit 4 works at a high speed in the most stable manners, even if the precharge signal PRC is maintained at an "H" level after completion of the charge of the bit line BL, when the precharge signal PRC changes to a "L" level, it is possible for the comparator circuit to work at a high speed in stable manners, and it is possible to increase the readout speed of the comparator circuit 4. The voltage change of the readout input node N1, together with the voltage changes of the precharge signal PRC and the node N2, is shown in the timing waveforms in FIG. 3. By the way, the hold voltage to be set by the hold circuit 6 of the readout input node N1 may be adjusted by adjusting the characteristics (channel width and channel length) of the PMOSs 21 and 22 of the feedback-type bias circuit 2 and thereby changing the ON resistance ratio of both the PMOSs.

Figure 4:
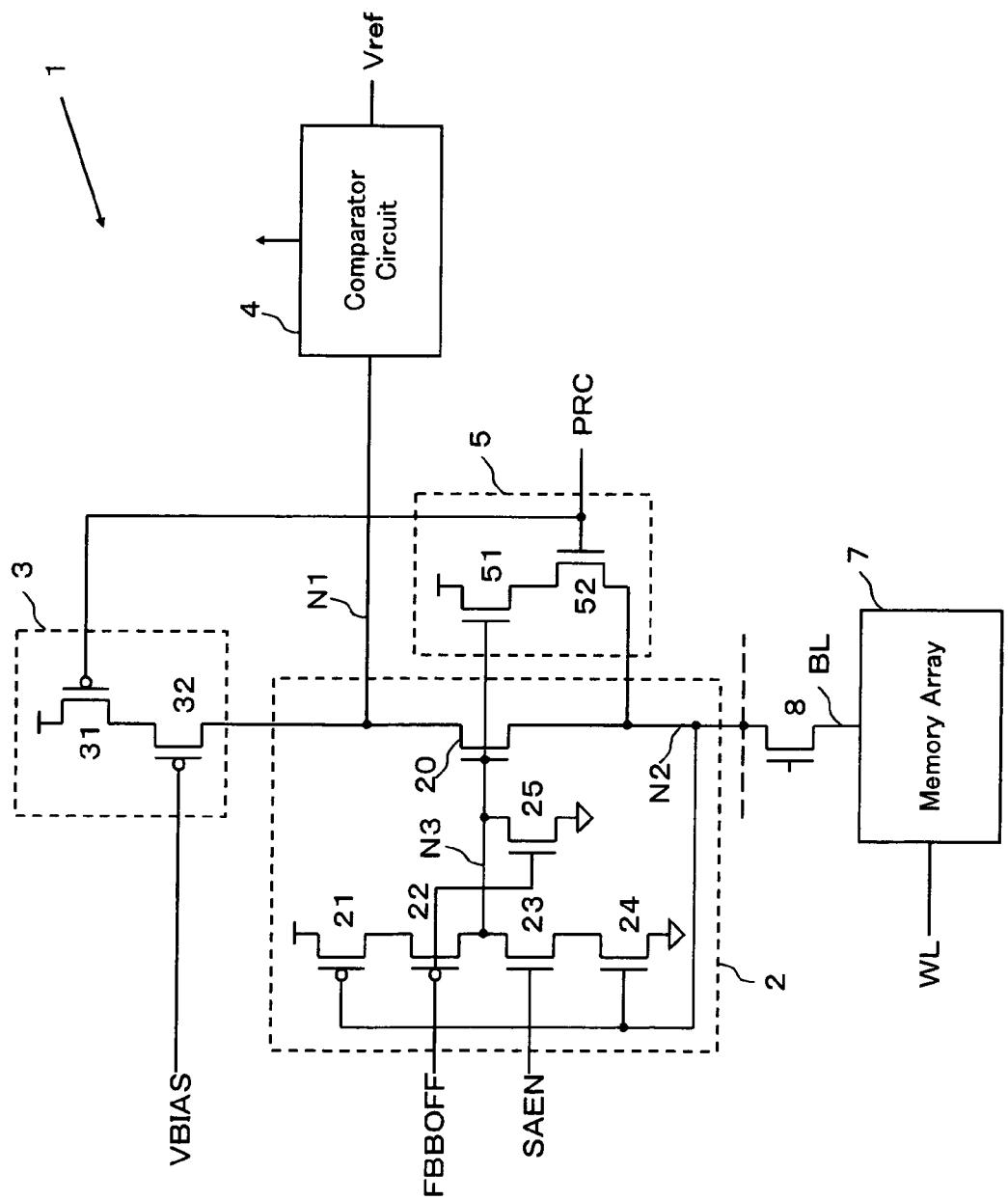
FIG. 4 is a circuit diagram showing a circuit configuration of another embodiment of the semiconductor readout circuit according to the present invention.

FIG. 4 is a circuit diagram showing a circuit configuration of another embodiment of the inventive circuit 1. FIG. 4, in comparison with the circuit configuration in FIG. 1, shows a circuit configuration without the hold circuit 6. The circuit operations of the another embodiment shown in FIG. 4 are the same that in FIG. 1 except that the charge of the comparator circuit 4 of the readout input node N1 to the appropriate input voltage by the hold circuit 6 is not carried out. Namely, the readout input node N1 will not rise above the voltage of the node N2 during the bit line charge (precharge period), and after completion of the bit line charge, even if the precharge signal PRC is maintained at an "H" level, the voltage of the node N1 will not rise over the voltage of the node N2. In comparison with the circuit configuration in FIG. 1, the readout input node N1 cannot be made to an arbitrary voltage level, but for example, with an NMOS input stage comparator circuit as shown in FIG. 21, high speed operations may be made with appropriate voltage of the node N2. Even in the circuit configuration in FIG. 4, even if the precharge signal PRC is maintained at an "H" level after completion of the bit line charge, there is no unnecessary voltage increase of the comparator circuit 4 that prevents the high speed operations of the comparator circuit 4 such as the conventional readout circuit shown in FIG. 18.

Figure 5:
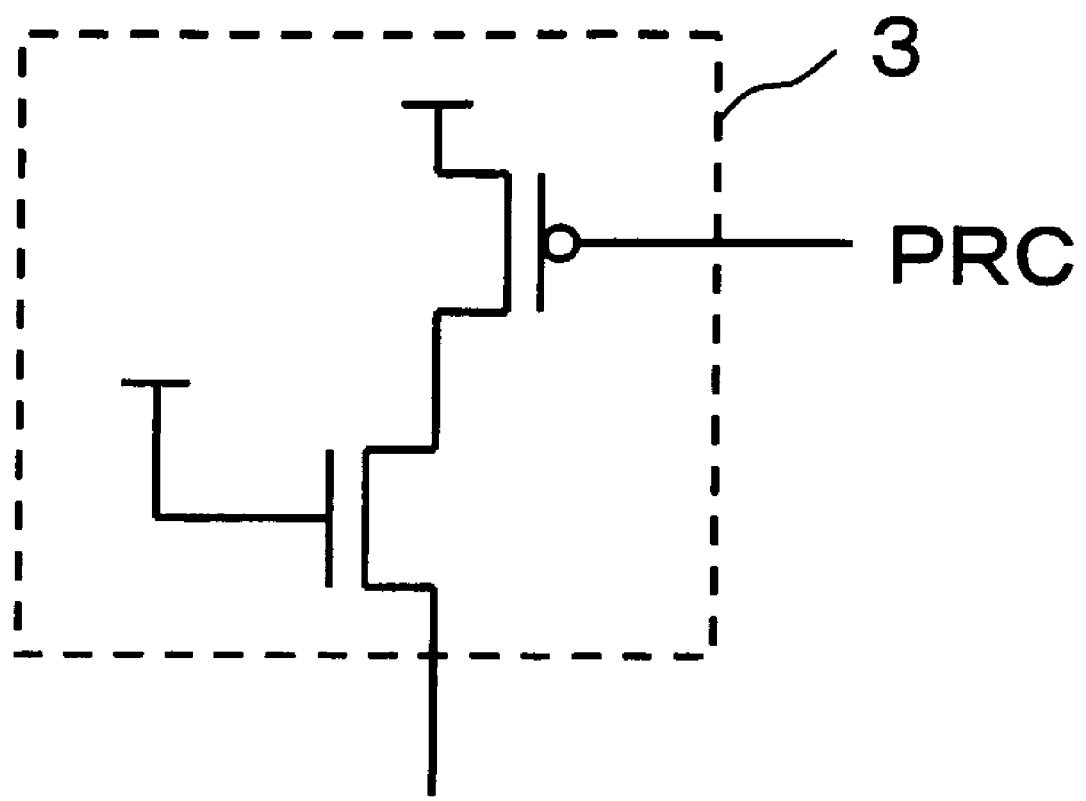
FIG. 5 is a circuit diagram showing a circuit configuration of a load circuit of the semiconductor readout circuit according to the present invention.
Figure 6:
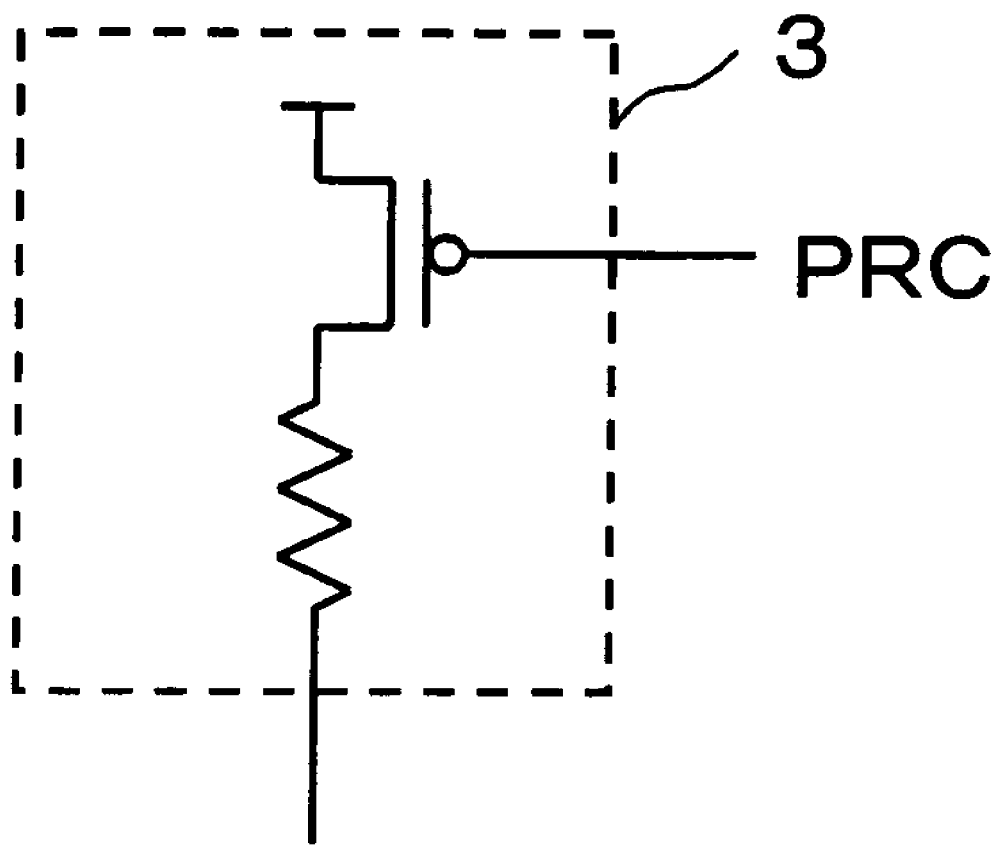
FIG. 6 is a circuit diagram showing another circuit configuration of the load circuit of the semiconductor readout circuit according to the present invention.

In the inventive circuit 1 shown in FIGS. 1 and 4, the load circuit 3 is structured by the PMOS 32 whose gate input is a bias voltage VBIAS as an example, however, as shown in FIGS. 5 and 6, it may be structured by an NMOS or a resistor element or the like in the place of the PMOS 32.

Figure 7:
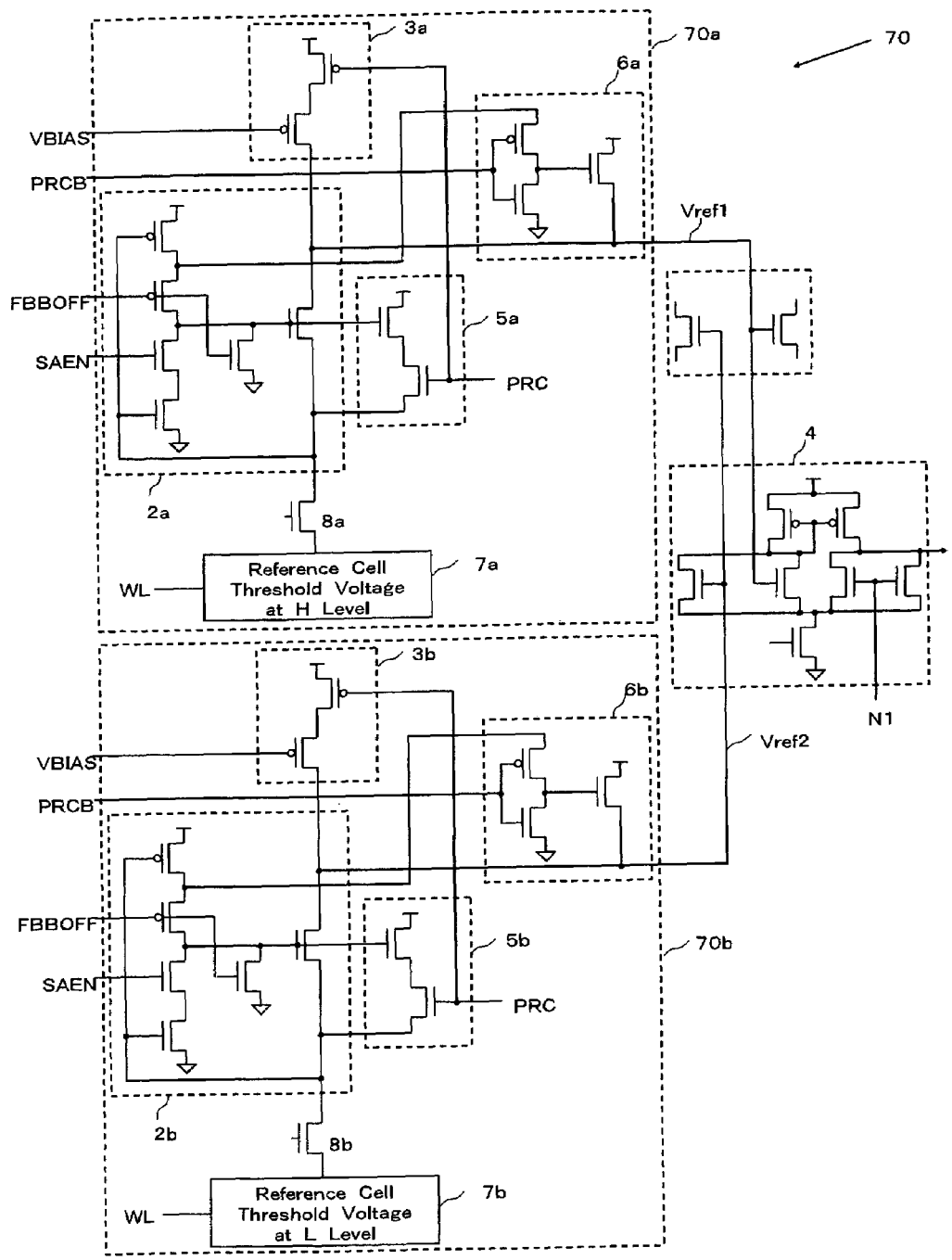
FIG. 7 is a circuit diagram showing a circuit configuration of a reference voltage generation circuit of the semiconductor readout circuit according to the present invention.

Next, a reference voltage generation circuit that generates the reference voltage Vref that is input to the comparator circuit 4 of the inventive circuit 1 will be described hereinafter. FIG. 7 shows a circuit configuration example of a reference voltage generation circuit 70. As the reference voltage generation circuit 70, two or more circuit configurations same as the circuit configuration in FIG. 1 (two in FIG. 7) are prepared, as a first reference voltage generation circuit 70a and a second reference voltage generation circuit 70b respectively. Each of the reference voltage generation circuits 70a and 70b includes reference feedback-type bias circuits 2a and 2b of the same circuit configuration as the feedback-type bias circuit 2 in FIG. 1, reference load circuits 3a and 3b of the same circuit configuration as the load circuit 3 in FIG. 1, reference precharge circuits 5a and 5b of the same circuit configuration as the precharge circuit 5 in FIG. 1, reference hold circuits 6a and 6b of the same circuit configuration of the hold circuit 6 in FIG. 1, reference cells 7a and 7b of the same element structure as the memory cells in the memory array 7, and NMOSs 8a and 8b same as the bit line selection transistor 8, and is structured in the same manners as the circuit configuration shown in FIG. 1. Further, as shown in FIG. 7, as for input signals to the respective circuits, the same input signals as to the respective circuits in FIG. 1 are used.

Herein, the difference between the first reference voltage generation circuit 70a and the second reference voltage generation circuit 70b is that the threshold voltage of reference cell 7a is set to the higher threshold voltage of the memory cell, while the threshold voltage of the reference cell 7b is set to the lower threshold voltage of the memory cell. Therefore, the first reference voltage Vref1 that the first reference voltage generation circuit 70a generates becomes same as the voltage of the readout input node N1 in the case where the threshold voltage of the memory cell is high, in the readout circuit in FIG. 1 or 4, and the second reference voltage Vref2 that the second reference voltage generation circuit 70b generates becomes same as the voltage of the readout input node N1 in the case where the threshold voltage of the memory cell is low, in the readout circuit in FIG. 1 or 4, at a same timing respectively.

In the comparator circuit 4, as shown in FIG. 7, an NMOS at each input stage of differential inputs is structured by a parallel circuit of two NMOSs, and to the gate of each NMOS of one differential input, the first reference voltage Vref1 and the second reference voltage Vref2 are input separately, and to the gate of each NMOS of the other differential input, the voltage of the readout input node N1 is input. Further, as for the reference voltage side, in order to make the gate capacity same as the memory cell (readout input node N1) side, a dummy MOSFET is added to the node of each reference voltage, or each reference voltage is used as to function as reference voltage input of other comparator circuit 4.

As a point of circuit operations in the circuit configuration in FIG. 1, the ON state and the OFF state of the transfer gate 20 has been described, meanwhile, in order to realize the same operations as this, by preparing the same circuit as the circuit which is connected to the memory cell to be read out as the reference voltage generation circuit 70, even with fluctuations in operation voltages and operation temperatures, the same operations as the memory cell to be read out may be realized at the reference side too. Therefore, stable high speed readout becomes possible.

Figure 8:
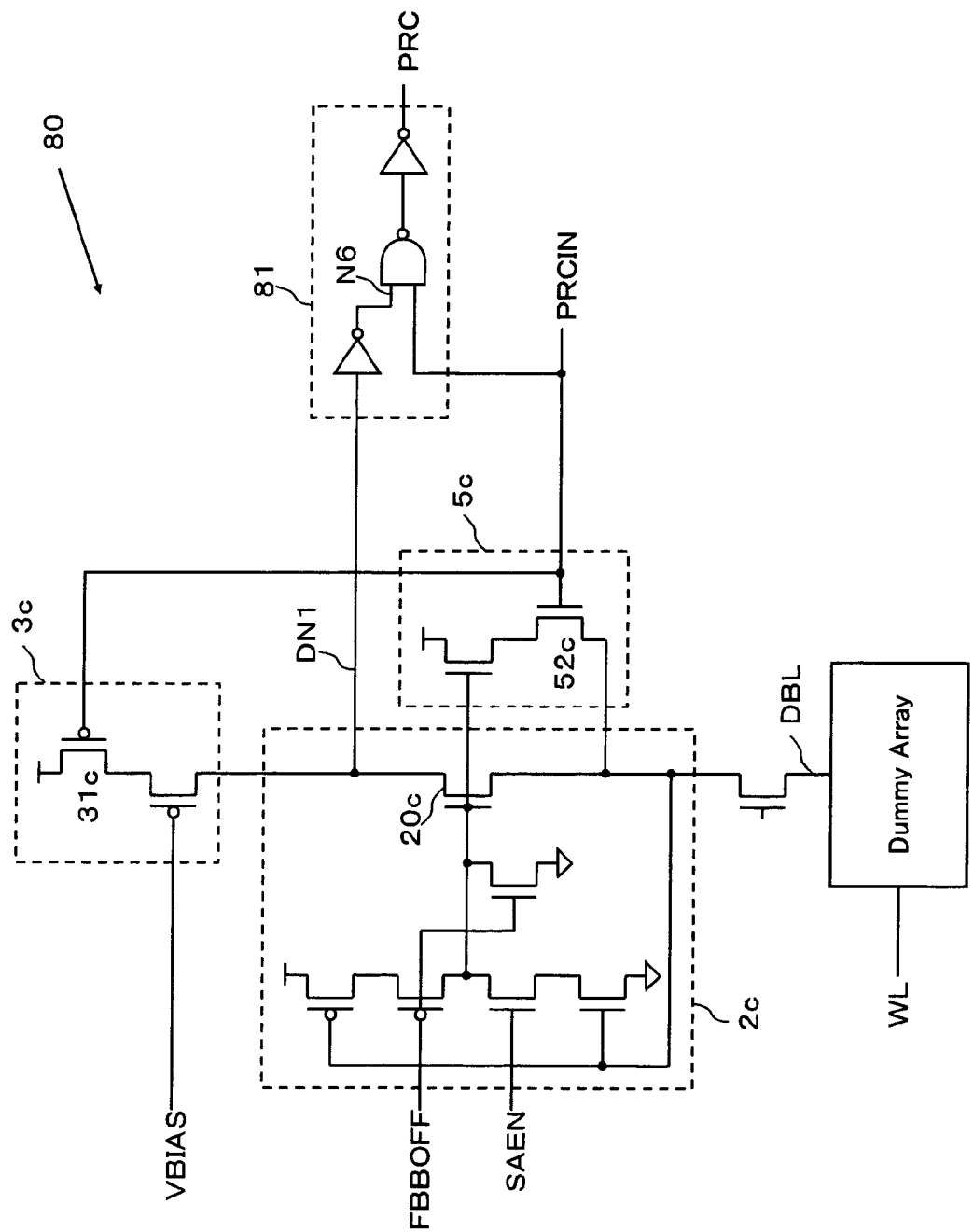
FIG. 8 is a circuit diagram showing a circuit configuration of a precharge signal generation circuit of the semiconductor readout circuit according to the present invention.

Next, a precharge signal generation circuit 80 which determines the active period (precharge period) of the precharge circuit 5 in the inventive circuit 1 will be described hereinafter. FIG. 8 shows circuit configuration example of the precharge signal generation circuit 80. The precharge signal generation circuit 80 includes a dummy bit line DBL whose parasitic capacity and parasitic resistance are same as those of the bit line BL connected to the memory array 7 in FIG. 1, a dummy precharge circuit 5c which may charge the dummy bit line DBL by the same charge current as the precharge circuit 5 in FIG. 1 up to the same charge voltage, a dummy feedback-type bias circuit 2c of the same circuit configuration as the feedback-type bias circuit 2 in FIG. 1 which controls the voltage of the dummy bit line DBL at a predetermined voltage, a dummy load circuit 3c which may charge a dummy readout input node DN1 connected to the dummy bit line DBL via the transfer gate 20c of the dummy feedback-type bias circuit 2c by the same charge current as the load circuit 3 in FIG. 1, and a logic circuit unit 81 which generates a precharge signal PRC from voltage changes of the dummy readout input node DN1. Herein, the dummy readout input node DN1 corresponds to the readout input node N1 in the inventive circuit 1 in FIG. 1, and by detecting voltage changes of the dummy readout input node DN1, detects the charge completion timing of the bit line BL in the inventive circuit 1. The dummy load circuit 3c is different from the load circuit 3 in FIG. 1 in that GND voltage is input to the gate of a PMOS 31c at the power source voltage side, therefore, it is always in an ON state during the precharge of the inventive circuit 1, and along with the voltage increase of the dummy bit line DBL, the voltage of the dummy readout input node DN1 increases.

Figure 9:
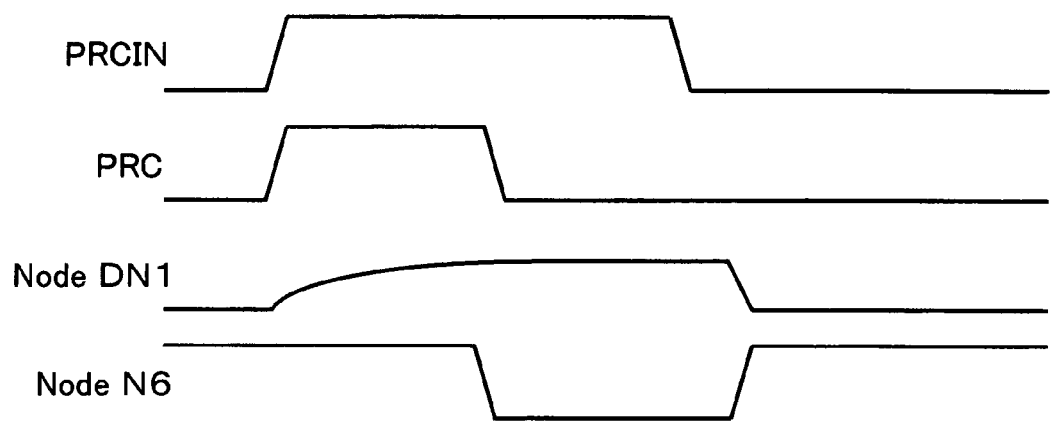
FIG. 9 is a timing chart showing a timing relation of an input signal, an output signal and voltage changes of an internal node of the precharge signal generation circuit of the semiconductor readout circuit according to the present invention.

FIG. 9 shows voltage waveforms of the control signal PRCIN which is input to the dummy precharge circuit 5c and the logic circuit unit 81, the precharge signal PRC that the precharge signal generation circuit 80 outputs, the dummy readout input node DN1, and the internal node N6 of the logic circuit unit 81. The control signal PRCIN is the signal which is generated by use of an inverter delay circuit or the like on the basis of the signal generated by an address transition detection circuit or the like, wherein the "H" level period is sufficiently longer than the precharge period. By the rise in this control signal PRCIN, the rise of the precharge signal PRC is determined, and the timing to determine the fall of the precharge signal PRC, i.e., the precharge period of the inventive circuit 1 is determined by voltage changes of the dummy readout input node DN1. Thereby, the necessary and sufficient precharge period of the inventive circuit 1 is secured by the precharge signal PRC, even when operation voltages and operation temperatures and the like change.

Figure 10:
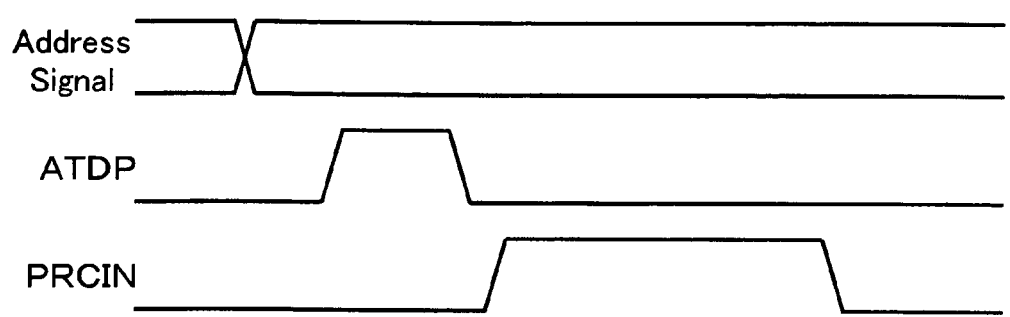
FIG. 10 is a timing chart showing a timing relation of an input signal and an address signal of the precharge signal generation circuit of the semiconductor readout circuit according to the present invention.

FIG. 10 shows a timing relation of the control signal PRCIN, the signal generated by the address transition detection circuit, and the address signal which is input to a semiconductor device equipped with the inventive circuit 1. The timing shown in FIG. 10 shows a case where the control signal PRCIN rises in response to the fall of the address transition detection signal ATDP. And, in order to adjust the fall timing of the precharge signal PRC, for example, an inverter delay circuit may be added to the logic circuit unit 81, or the length of the dummy bit line DBL may be made different from the length of the bit line BL to be connected to the memory array 7, and thereby the parasitic capacity and parasitic resistance of the dummy bit line DBL may be adjusted.

Figure 11:
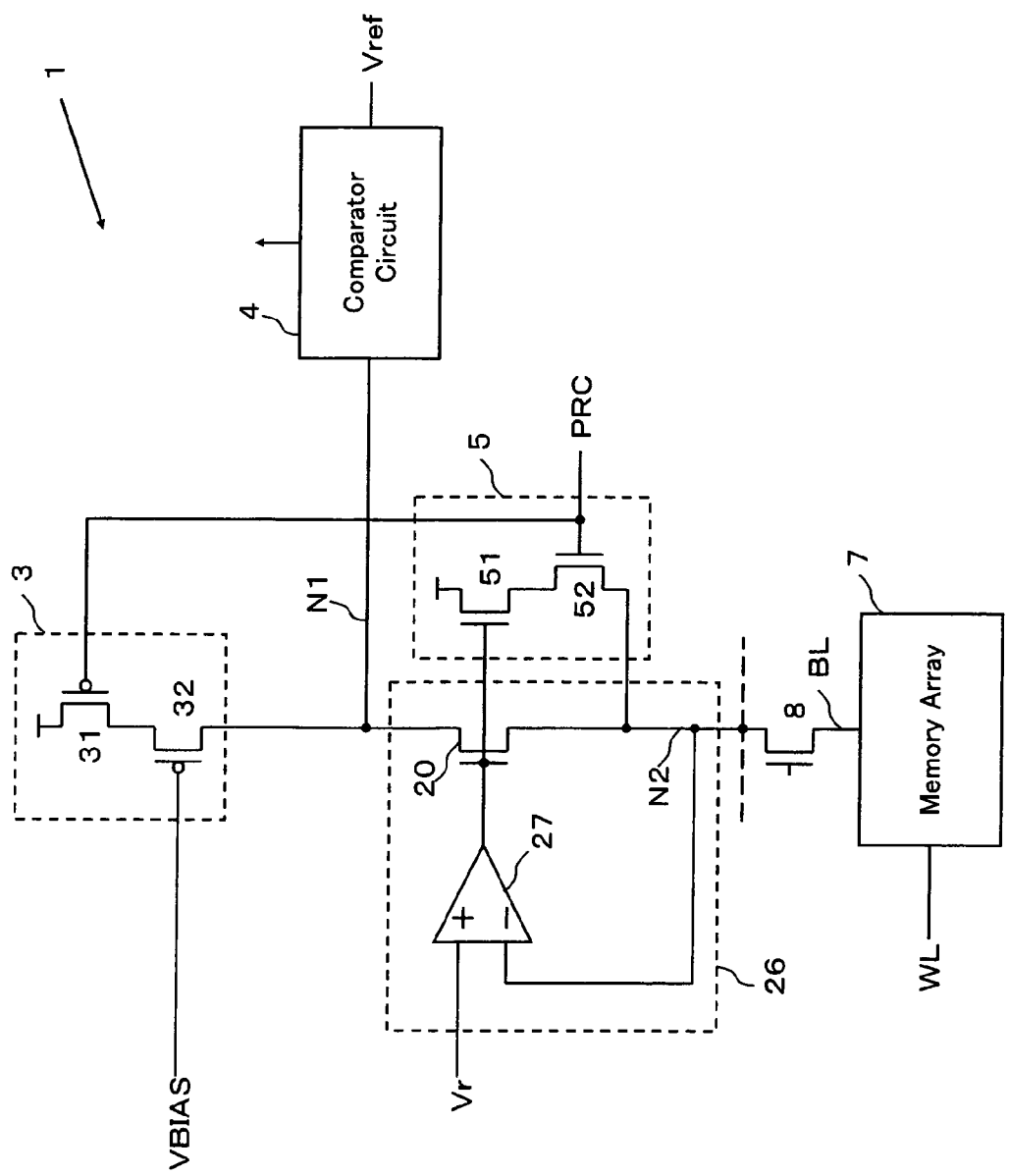
FIG. 11 is a circuit diagram showing an another circuit configuration of a feedback-type bias circuit of the semiconductor readout circuit according to the present invention.

Next, another embodiment of the feedback-type bias circuit 2 of the inventive circuit 1 will be described hereinafter. FIG. 11 shows a circuit example of a feedback-type bias circuit 26 according to another embodiment. The feedback-type bias circuit 26 in FIG. 11 includes the same transfer gate 20 as the feedback-type bias circuit 2 in FIG. 1, and a comparator circuit 27 which takes a reference voltage Vr and the voltage of the node N2 as inputs. The internal node N3 shifts to an "H" level when the voltage of the node N2 is lower than the reference voltage Vr, while it shifts to a "L" level when the voltage of the node N2 is higher. Thereby, a difference in the ON/OFF operations of the transfer gate 20 between the case when the threshold voltage of the memory cell is high and the case when it is low, and the voltage changes of the readout input node N1 are made at a higher speed. As a result, stable and high speed readout operations can be realized.

Figure 12:
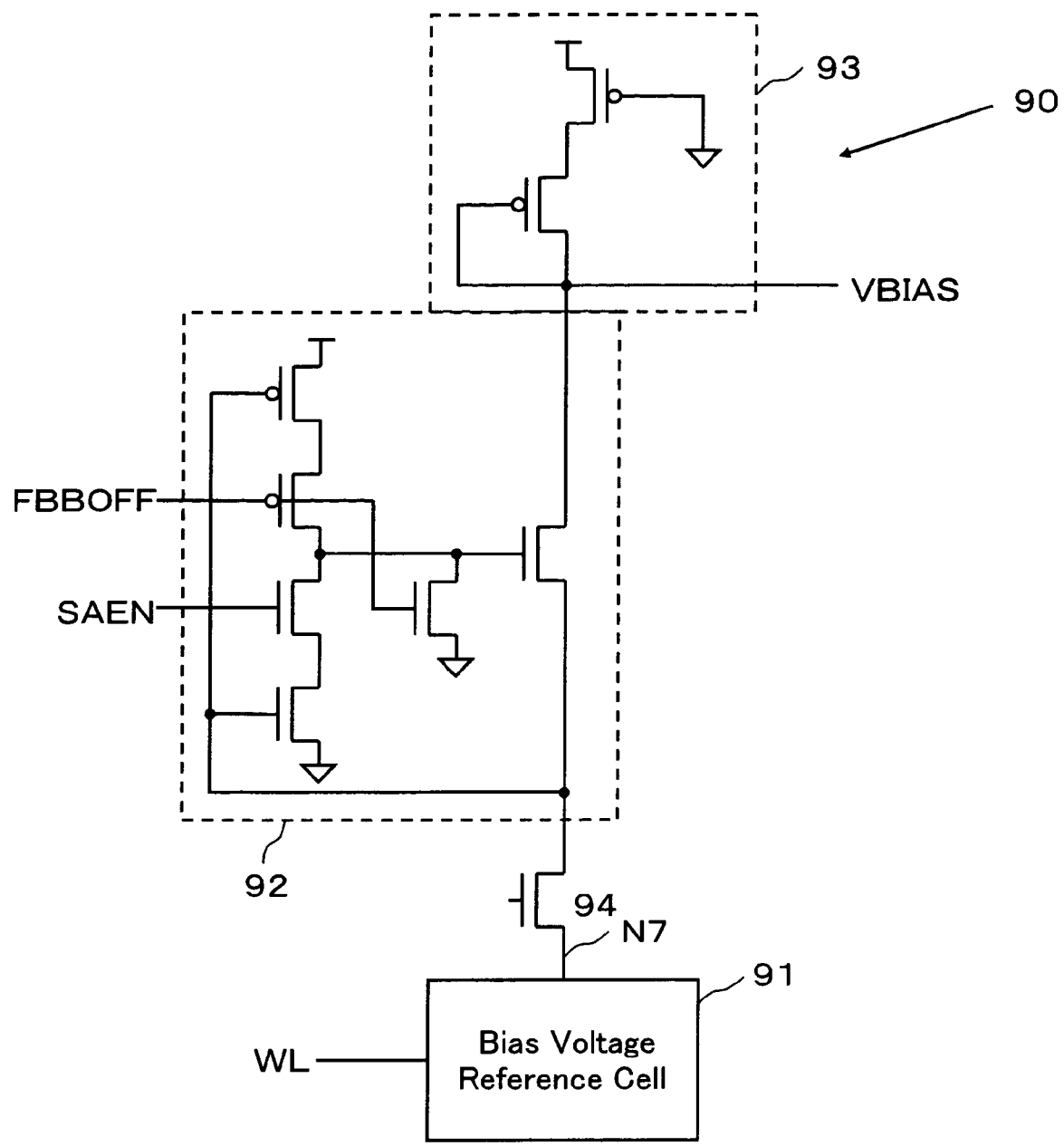
FIG. 12 is a circuit diagram showing a circuit configuration of a bias voltage generation circuit of the semiconductor readout circuit according to the present invention.

Next, a bias voltage generation circuit which generates a bias voltage VBIAS which is input to the gate of the PMOS 32 of the load circuit 3 of the inventive circuit 1 will be described hereinafter. FIG. 12 is a circuit configuration example of a bias voltage generation circuit 90.

As shown in FIG. 12, the bias voltage generation circuit 90 includes a reference feedback-type bias circuit 92 of the same circuit configuration as the feedback-type bias circuit 2 in FIG. 1, a reference load circuit 93 formed by a series circuit of two PMOSs in the same manner as the load circuit 3 in FIG. 1, an NMOS 94 of the same characteristic as the bit line selection transistor 8, and a bias voltage generation reference cell 91 of the same element structure as for example the memory cell in the memory array 7. The bias voltage VBIAS is a predetermined voltage which is determined by the currents of the reference load circuit 93 and the bias voltage generation reference cell 91, and becomes a gate input of the PMOS 32 of the load circuit 3. The bias voltage VBIAS may be freely adjusted by the threshold voltage of the bias voltage generation reference cell 91. Further, it may be freely adjusted by adjusting the current supply capacity of the reference load circuit 93, for example, the gate width or the gate length of the PMOSs 31 and 32.

And, the internal node N7 of the bias voltage generation circuit 90 is an extremely short wire, different from the bit line BL which is connected to the memory cell in the memory array 7, and, as for the gate voltage to be input to the bias voltage generation reference cell 91, the voltage of the word line connected to the memory cell may be input. Because many memory cells do not connect to the internal node N7 though many memory cells do connect in the memory array 7, it is possible to change the gate voltage of the bias voltage generation reference cell 91 at a high speed. Accordingly, it is possible to output the predetermined voltage as the bias voltage VBIAS in an extremely short time, and it is possible to generate the predetermined voltage without a problem, when the load circuit 3 requires the bias voltage VBIAS. The reference feedback-type bias circuit 92 is for fixing the drain voltage (voltage of the node N7) of the bias voltage generation reference cell 91, if there is no influence of the fluctuation in the drain voltage upon the bias voltage VBIAS characteristic to be input to the gate of the PMOS 32 of the load circuit 3, the reference feedback-type bias circuit 92 is not necessarily arranged.

Figure 13:
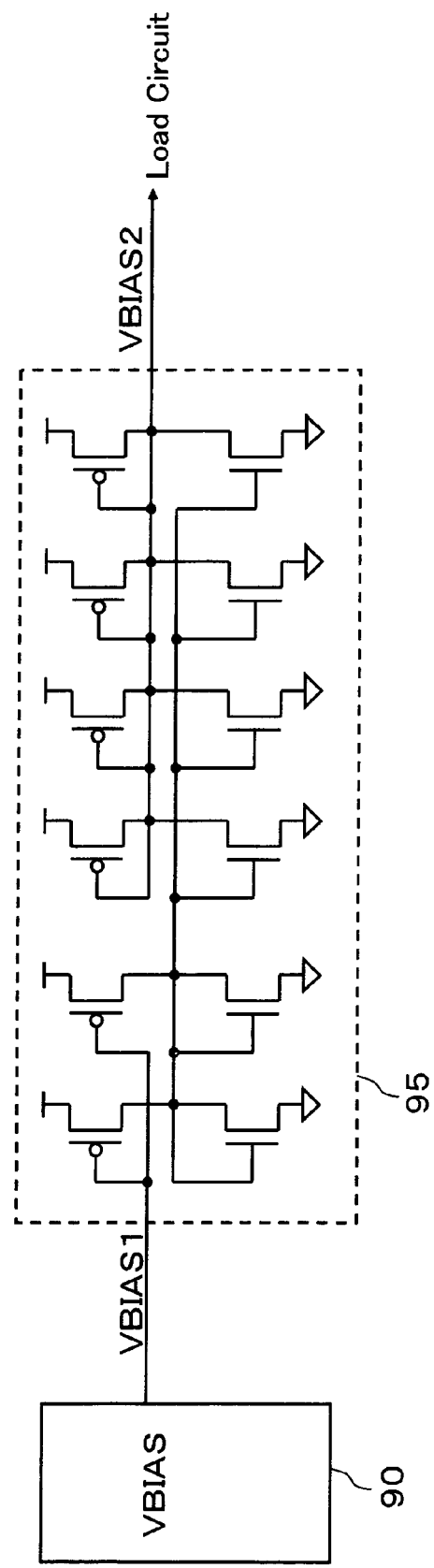
FIG. 13 is a circuit diagram showing another circuit configuration of the bias voltage generation circuit of the semiconductor readout circuit according to the present invention.

FIG. 13 shows another circuit configuration of a bias voltage generation circuit. The circuit configuration shown in FIG. 13 is a structure for the case when the bias voltage VBIAS is supplied in common to plural load circuits 3 of the inventive circuit 1, the load capacity that the bias voltage VBIAS drives becomes large, and it takes time to fix a predetermined output voltage. As shown in FIG. 13, the output VBIAS of the bias voltage generation circuit 90 in FIG. 12 is connected to the node VBIAS1 of an amplification circuit 95, and the node VBIAS2 of the amplification circuit 95 is made as gate input of the PMOS 32 of the load circuit 2. The current which flow through the node N7 of the bias voltage generation circuit 90 is amplified by the amplification circuit 95, and the time until the output voltage of the node VBIAS2 becomes stable is shortened.

Figure 14:
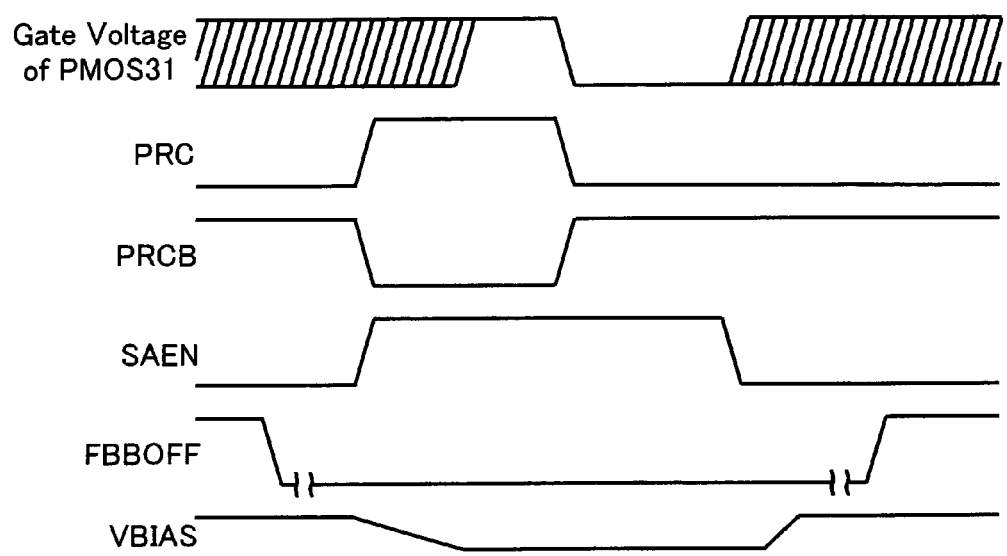
FIG. 14 is a timing chart showing a timing relation of a precharge signal and various control signals in still another embodiment of the semiconductor readout circuit according to the present invention.
Figure 15:
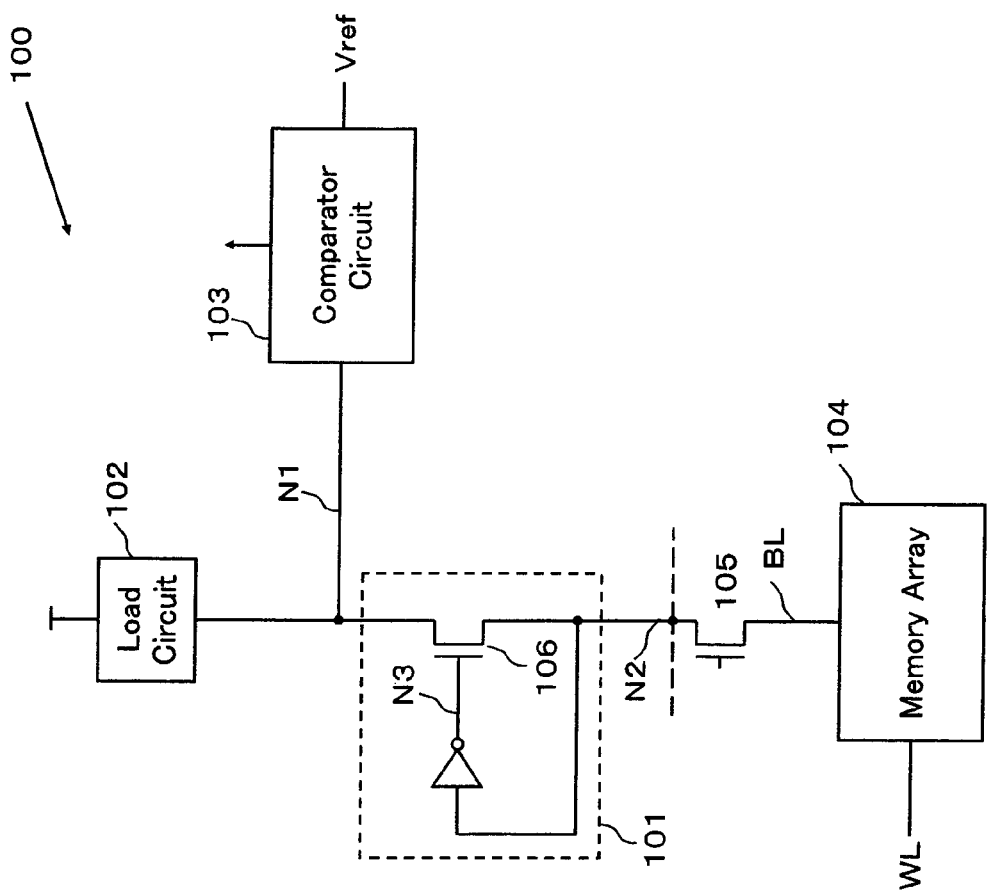
FIG. 15 is a block diagram showing a circuit configuration of a conventional semiconductor readout circuit.

In the embodiment described above, the structure has been described wherein the precharge signal PRC which is input to the precharge circuit 5 is input to the gate of the PMOS 31 of the load circuit 3 of the inventive circuit 1, however, the gate input of the PMOS 31 of the load circuit 3 is not necessarily the precharge signal PRC. For example, as shown in FIG. 14, gate input may be a control signal which becomes an "H" level for the period from the moment just before the charge completion timing of the bit line BL to the moment of completion of the precharge period. By making such a control signal as gate input, it is possible to prevent the voltage of the readout input node N 1 from being charged unnecessarily by the load circuit 3 after completion of the charge of the bit line BL. Further, the gate input of the PMOS 31 may be an "H" level from the moment before the start of the precharge period.

The inventive circuit 1 may be applied to a flash memory wherein memory cells in the memory array 7 are flash memories as in the embodiment, and besides flash memory array, it may be applied to cases where memory arrays are structured by memory elements which memorize data by the size of memory cell current. For example, it may be applied to a semiconductor memory device equipped with a memory array comprising side wall type nonvolatile memory cells equipped with an electric charge hold area at the side of control gate (memory elements called side wall memories).

As described in detail heretofore, according to adoption of the inventive circuit, it is possible to carry out memory cell readout operations at a high speed, and to realize improved performances of a semiconductor memory device. Further, it is possible to carry out effective and high speed readout operations even in the case where bit line capacity and resistance are large, and by making the bit line length long and making the number of memory array blocks small, chip size contraction may be realized, which may contribute to reduction of manufacturing costs.

Although the present invention has been described in terms of the preferred embodiments, it will be appreciated that various modifications and alterations might be made by those skilled in the art without departing from the spirit and scope of the invention. The invention should be therefore measured in terms of the claims which follow.

What is claimed is:

1. A semiconductor readout circuit comprising:
   a precharge circuit which charges a bit line connected to a memory cell to a predetermined precharge voltage before reading out information stored in the memory cell;
   a feedback-type bias circuit which controls a voltage of the bit line to its predetermined voltage;
   a sense amplifier which detects and amplifies a change in a voltage of a readout input node connected to the bit line via a transfer gate of the feedback-type bias circuit; and
   a load circuit which charges the readout input node, wherein
   the load circuit is made inactive at least for a fixed period immediately before the ending of a precharge period when the precharge circuit is active, and is made active after ending of the precharge period.

2. A semiconductor readout circuit according to claim 1, wherein
   the sense amplifier is constituted of a comparator circuit differential inputs of which are a voltage of the readout input node and a predetermined reference voltage.

3. A semiconductor readout circuit according to claim 2, further comprising:
   a reference voltage generation circuit which generates the reference voltage, wherein
   the reference voltage generation circuit includes:
   a reference load circuit having the same circuit configuration as that of the load circuit;
   a reference precharge circuit having the same circuit configuration as that of the precharge circuit;
   a reference feedback-type bias circuit having the same circuit configuration as that of the feedback-type bias circuit; and
   a reference cell having the same element structure as that of the memory cell.

4. A semiconductor readout circuit according to claim 3, wherein
   the reference voltage generation circuit is constituted of a pair of a first reference voltage generation circuit in which a cell current of the reference cell is set to a cell current corresponding to one memory state of the memory cell and a second reference voltage generation circuit in which the cell current of the reference cell is set to a cell current corresponding to another memory state of the memory cell, and
   a first reference voltage generated from the first reference voltage generation circuit and a second reference voltage generated from the second reference voltage generation circuit are input in parallel with each other to one side of the differential inputs of the comparator circuit.

5. A semiconductor readout circuit according to claim 1, further comprising:

a hold circuit which holds the voltage of the readout input node at a predetermined hold voltage at least during the load circuit is inactive.

6. A semiconductor readout circuit according to claim 5, wherein
the hold circuit includes an N-type MOSFET which has a source connected to the readout input node, a drain connected to a power supply voltage, and a gate connected to a predetermined intermediate voltage for determining the hold voltage.

7. A semiconductor readout circuit according to claim 6, wherein
the intermediate voltage is supplied from an internal node of the feedback-type bias circuit.

8. A semiconductor readout circuit according to claim 7, wherein
the intermediate voltage is determined by a circuit constant in the feedback-type bias circuit as an intermediate voltage between the gate voltage of the transfer gate in the feedback-type bias circuit and the power supply voltage.

9. A semiconductor readout circuit according to claim 1, wherein
the load circuit is constituted of a P-type MOSFET capable of controlling an amount of current supplied from the load circuit by a bias voltage input to a gate, and
the bias voltage is adjusted so that the amount of current of the P-type MOSFET is within a range of a memory cell current which changes according to the information stored in the memory cell.

10. A semiconductor readout circuit according to claim 9, further comprising:
a bias voltage generation circuit which generates the bias voltage, wherein
the bias voltage generation circuit includes:
a bias voltage generating reference cell; and
a second load circuit which flows the same amount of load current as that of cell current of the bias voltage generating reference cell, and by the amount of load current thereof can control an amount of load current of the load circuit, and
the cell current of the bias voltage generating reference cell is set at an intermediate level between two cell currents corresponding to two memory states of the memory cell.

11. A semiconductor readout circuit according to claim 1, further comprising:
a precharge signal generation circuit which generates a precharge signal for activating the precharge circuit, wherein
the precharge signal generation circuit includes:
a dummy bit line which simulates the bit line;
a dummy precharge circuit which can charge the dummy bit line with the same charge current as that of the precharge circuit to the same charge voltage as that of the precharge circuit;
a dummy feedback-type bias circuit having the same circuit configuration as that of the feedback-type bias circuit, which controls a voltage of the dummy bit line to its predetermined voltage; and
a dummy load circuit which can charge a dummy readout input node connected to the dummy bit line via a transfer gate of the dummy feedback-type bias circuit with the same charge current as that of the load circuit, and
the precharge signal generation circuit detects a charge state of the dummy bit line based on the voltage of the dummy readout input node, and stops generating the precharge signal.

12. A semiconductor readout circuit according to claim 1, wherein
the feedback-type bias circuit includes a comparator circuit having a predetermined reference voltage and the voltage of the bit line as differential inputs, and an output of the comparator circuit is constituted as a gate input of the transfer gate.

13. A semiconductor memory device comprising a semiconductor readout circuit according to claim 1.

14. A semiconductor memory device according to claim 13, wherein
the memory cell in the semiconductor readout circuit is a nonvolatile memory cell having a floating gate structure.

15. A semiconductor memory device according to claim 13, wherein
the memory cell in the semiconductor readout circuit is a sidewall-type nonvolatile memory cell having an electric charge retention region at a side of a control gate.

* * * * *